United States Patent
Gupta et al.

(10) Patent No.: US 11,456,208 B2
(45) Date of Patent: Sep. 27, 2022

(54) METHODS OF FORMING APPARATUSES INCLUDING AIR GAPS BETWEEN CONDUCTIVE LINES AND RELATED APPARATUSES, MEMORY DEVICES, AND ELECTRONIC SYSTEMS

(71) Applicant: Micron Technology, Inc., Boise, ID (US)

(72) Inventors: Sidhartha Gupta, Boise, ID (US); David Ross Economy, Boise, ID (US); Richard J. Hill, Boise, ID (US); Kyle A. Ritter, Boise, ID (US); Naveen Kaushik, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/990,463

(22) Filed: Aug. 11, 2020

(65) Prior Publication Data
US 2022/0051930 A1 Feb. 17, 2022

(51) Int. Cl.
*H01L 21/768* (2006.01)
*H01L 23/522* (2006.01)
(Continued)

(52) U.S. Cl.
CPC .... *H01L 21/7682* (2013.01); *H01L 21/76816* (2013.01); *H01L 21/76877* (2013.01);
(Continued)

(58) Field of Classification Search
CPC .............. H01L 21/7682; H01L 21/764; H01L 2221/1042–1047; H01L 29/0649–0653;
(Continued)

(56) References Cited

U.S. PATENT DOCUMENTS

| 4,641,417 A | 2/1987 | McDavid |
| 5,780,919 A | 7/1998 | Chua et al. |

(Continued)

FOREIGN PATENT DOCUMENTS

| CN | 111785728 A | * 10/2020 |
| KR | 10-2004-0051189 A | 6/2004 |

(Continued)

OTHER PUBLICATIONS

Machine Translation of CN111785728, originaly published on Oct. 16, 2020.*

(Continued)

*Primary Examiner* — Younes Boulghassoul
(74) *Attorney, Agent, or Firm* — TraskBritt

(57) ABSTRACT

A method of forming an apparatus includes forming pillar structures extending vertically through a first isolation material, forming conductive lines operatively coupled to the pillar structures, forming dielectric structures overlying the conductive lines, and forming air gaps between neighboring conductive lines. The air gaps are laterally adjacent to the conductive lines with a portion of the air gaps extending above a plane of an upper surface of the laterally adjacent conductive lines and a portion of the air gaps extending below a plane of a lower surface of the laterally adjacent conductive lines. Apparatuses, memory devices, methods of forming a memory device, and electronic systems are also disclosed.

31 Claims, 6 Drawing Sheets

(51) Int. Cl.
*H01L 23/528* (2006.01)
*H01L 23/532* (2006.01)
*H01L 27/11582* (2017.01)
*H01L 27/11556* (2017.01)

(52) U.S. Cl.
CPC .... *H01L 21/76897* (2013.01); *H01L 23/5226* (2013.01); *H01L 23/5283* (2013.01); *H01L 23/5329* (2013.01); *H01L 27/11556* (2013.01); *H01L 27/11582* (2013.01)

(58) Field of Classification Search
CPC ........... H01L 23/5222; H01L 27/11582; H01L 27/11556; H01L 27/11568; H01L 27/11521; H01L 27/11524; H01L 27/1157; H01L 21/76877; H01L 21/76816; H01L 21/76897; H01L 21/76802; H01L 23/5226; H01L 23/5283; H01L 23/481
See application file for complete search history.

(56) References Cited

U.S. PATENT DOCUMENTS

| | | | |
|---|---|---|---|
| 6,636,415 | B2 | 10/2003 | Tang et al. |
| 7,830,016 | B2 | 11/2010 | Meldrim et al. |
| 8,546,239 | B2 | 10/2013 | Harari et al. |
| 8,599,616 | B2 | 12/2013 | Roizin et al. |
| 8,778,749 | B2 | 7/2014 | Pachamuthu et al. |
| 9,177,853 | B1 | 11/2015 | Futase et al. |
| 9,337,203 | B2 | 5/2016 | Hwang et al. |
| 9,425,200 | B2 | 8/2016 | Hwang et al. |
| 9,460,958 | B2 | 10/2016 | Purayath et al. |
| 9,524,904 | B2 | 12/2016 | Ohori et al. |
| 9,698,149 | B2 | 7/2017 | Purayath et al. |
| 9,786,598 | B2 | 10/2017 | Kim et al. |
| 10,115,459 | B1* | 10/2018 | Yamada ............... H01L 27/1157 |
| 10,236,047 | B1 | 3/2019 | Ryan et al. |
| 10,418,354 | B2 | 9/2019 | Ryu et al. |
| 10,566,333 | B2 | 2/2020 | Lee et al. |
| 10,734,400 | B1* | 8/2020 | Fukuo ............... H01L 21/76834 |
| 2007/0218318 | A1 | 9/2007 | Watanabe |
| 2009/0142925 | A1 | 6/2009 | Ha et al. |
| 2011/0248252 | A1 | 10/2011 | Ohnishi et al. |
| 2012/0058639 | A1* | 3/2012 | Sim .................... H01L 23/5222 438/666 |
| 2013/0168757 | A1 | 7/2013 | Hong |
| 2013/0228934 | A1* | 9/2013 | Kim ..................... H01L 23/481 257/774 |
| 2013/0320050 | A1 | 12/2013 | Kim |
| 2014/0159135 | A1 | 6/2014 | Fujimoto et al. |
| 2014/0175659 | A1 | 6/2014 | Lee et al. |
| 2014/0231908 | A1 | 8/2014 | Chen et al. |
| 2015/0076708 | A1* | 3/2015 | Kaneko ............ H01L 27/11573 257/774 |
| 2015/0228531 | A1* | 8/2015 | Tagami ............... H01L 21/7682 438/618 |
| 2015/0243708 | A1 | 8/2015 | Ravasio et al. |
| 2016/0093635 | A1* | 3/2016 | Rabkin ............. H01L 21/76802 257/314 |
| 2016/0141337 | A1 | 5/2016 | Shimabukuro et al. |
| 2016/0247783 | A1* | 8/2016 | Minami ............... H01L 29/6656 |
| 2016/0276273 | A1 | 9/2016 | Kwon et al. |
| 2016/0276282 | A1* | 9/2016 | Tagami ............... H01L 21/7682 |
| 2017/0040207 | A1 | 2/2017 | Purayath et al. |
| 2017/0076974 | A1 | 3/2017 | Choi et al. |
| 2017/0256485 | A1* | 9/2017 | Tagami ............... H01L 21/7682 |
| 2017/0256551 | A1* | 9/2017 | Lee ................... H01L 27/11582 |
| 2019/0035733 | A1* | 1/2019 | Park .................. H01L 21/76816 |
| 2019/0043876 | A1 | 2/2019 | van Schravendijk et al. |
| 2019/0081049 | A1 | 3/2019 | Zang |
| 2020/0051993 | A1 | 2/2020 | Rabkin et al. |
| 2020/0176451 | A1 | 6/2020 | Kang et al. |
| 2020/0266206 | A1 | 8/2020 | Fukuo et al. |
| 2020/0303308 | A1* | 9/2020 | Kitamura .......... H01L 21/76897 |
| 2021/0193585 | A1* | 6/2021 | Said .................. H01L 21/76834 |

FOREIGN PATENT DOCUMENTS

| | | |
|---|---|---|
| WO | 2017/052494 A1 | 3/2017 |
| WO | 2019/036292 A1 | 2/2019 |

OTHER PUBLICATIONS

Jain et al., U.S. Appl. No. 16/743,329 title Memory Arrays and Methods Used in Forming a Memory Array filed Jan. 15, 2020.

Kaushik et al., U.S. Appl. No. 16/924,506 titled Integrated Assemblies Having Conductive-Shield-Structures Between Linear-Conductive-Structures, filed Jul. 9, 2020.

Mackus et al., From the Bottom-Up: Toward Area-Selective Atomic Layer Deposition with High Selectivity, Chemistry of Materials, vol. 31, (2019), pp. 2-12.

Vahdat et al., U.S. Appl. No. 16/793,263 titled Memory Arrays and methods Used in Forming A Memory Array filed Feb. 18, 2020.

* cited by examiner

METHODS OF FORMING APPARATUSES INCLUDING AIR GAPS BETWEEN CONDUCTIVE LINES AND RELATED APPARATUSES, MEMORY DEVICES, AND ELECTRONIC SYSTEMS

TECHNICAL FIELD

Embodiments disclosed herein relate to the field of microelectronic device design and fabrication. More particularly, embodiments of the disclosure relate to methods of forming apparatuses including air gaps between conductive lines (e.g., data lines, also referred to as bit lines), and to related apparatuses, memory devices, methods of forming a memory device, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more conductive stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

As the dimensions and spacing of the conductive features decrease, multilevel wiring structures have been used in memory devices (e.g., 3D NAND Flash memory devices) to electrically connect the conductive features to one another. The memory device includes the wiring structures at different levels, with the wiring structures formed of electrically conductive materials to provide conductive pathways through the memory device. As the dimensions and spacing of the conductive features continue to decrease, parasitic (e.g., stray) capacitance between adjacent conductive features within the memory device increases. The increased parasitic capacitance causes higher power demands and delay of the memory device. Air gaps have been used to electrically isolate the conductive features, such as conductive lines.

DETAILED DESCRIPTION

Figure 1A:
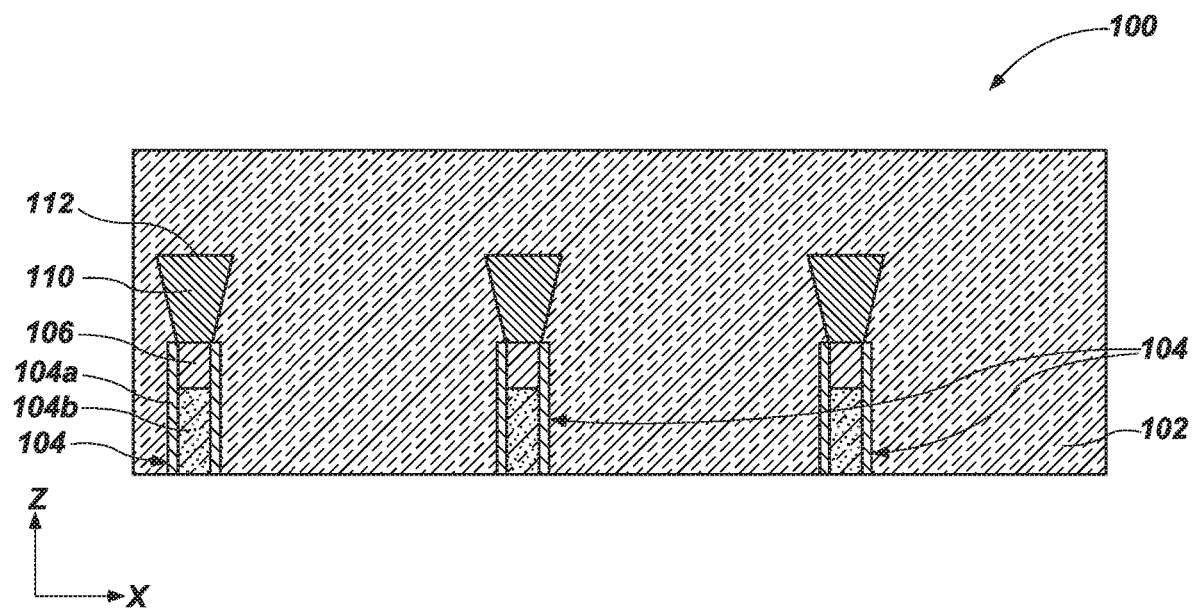
FIGS. 1A through 1F are simplified partial cross-sectional views illustrating a method of forming an apparatus, in accordance with embodiments of the disclosure.

Methods of forming an apparatus (e.g., a microelectronic device, a semiconductor device, a memory device) including air gaps (e.g., voids, unfilled volumes) between conductive lines (e.g., data lines, bit lines) are described herein, as are related apparatuses, memory devices, methods of forming a memory device, and electronic systems. In some embodiments, a method of forming an apparatus comprises forming pillar structures extending vertically through a first isolation material (e.g., a single dielectric material, a stack of alternating dielectric materials), forming conductive lines operatively coupled to the pillar structures, forming dielectric structures (e.g., a mask material) overlying the conductive lines, and forming air gaps between the conductive lines. The air gaps are laterally adjacent to the conductive lines, with a portion of the air gaps extending above a plane of an upper surface of the laterally adjacent conductive lines and a portion of the air gaps extending below a plane of a lower surface of the laterally adjacent conductive lines. Therefore, the air gaps extend a distance above and below a midpoint of the air gaps, with the midpoint of the air gaps positioned laterally adjacent to a midpoint of the conductive lines. In some embodiments, contact structures (e.g., contacts, bit line contacts) are formed adjacent to the pillar structures, and interconnect structures (e.g., contact vias, bit line vias) are formed directly between and operatively coupled with the contact structures and the conductive lines. The interconnect structures may be formed using a single damascene process and the conductive lines may be formed using a single subtractive patterning process. A portion of the air gaps may be laterally adjacent to the interconnect structures. Further, the openings of the air gaps may be formed to extend a vertical distance laterally adjacent to the dielectric structures, the conductive lines, and a portion of the interconnect structures. The openings may be formed by a single material removal process within a single chamber of a material removal device. By using a subtractive patterning process, a critical dimension (e.g., a width) of the conductive lines may be relatively less than a critical dimension (e.g., a width) of the air gaps laterally intervening between the adjacent conductive lines, which reduces parasitic capacitance between the adjacent conductive lines. By decreasing the parasitic capacitance, the apparatus containing the conductive lines according to embodiments of the disclosure may utilize less power and operate at higher speeds.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a microelectronic device or a complete process flow for manufacturing the microelectronic device and the structures described below do not form a complete microelectronic device. Only those process acts and structures necessary to understand the embodiments described herein are described in detail below. Additional acts to form a complete microelectronic device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "configured" refers to a size, shape, material composition, and arrangement of one or more of at least one structure and at least one apparatus facilitating operation of one or more of the structure and the apparatus in a pre-determined way.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "pitch" refers to a distance between identical points in two adjacent (i.e., neighboring) features.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the phrase "coupled to" refers to structures operatively connected with each other, such as electrically connected through a direct ohmic connection or through an indirect connection (e.g., via another structure).

As used herein, the term "selectively etchable" means and includes a material that exhibits a greater etch rate responsive to exposure to a given etch chemistry relative to another material exposed to the same etch chemistry. For example, the material may exhibit an etch rate that is at least about three times (3×) greater than the etch rate of another material, such as about five times (5×) greater than the etch rate of another material, such as an etch rate of about ten times (10×) greater, about twenty times (20×) greater, or about forty times (40×) greater than the etch rate of the another material. Etch chemistries and etch conditions for selectively etching a desired material may be selected by a person of ordinary skill in the art.

As used herein, "subtractive patterning" refers to one or more process acts where structures to be defined are formed by the removal of material. For example, a "subtractive patterning process" may include forming etch mask structures over areas to be patterned, followed by etching, such that materials in the areas masked by the mask structures are protected while materials in exposed areas are removed by the etch removal process.

As used herein, the term "air gap" means a volume extending into or through another region or material, or between regions or materials, leaving a void in that other region or material, or between regions or materials, that is empty of a solid and/or liquid material. An "air gap" is not necessarily empty of a gaseous material (e.g., air, oxygen, nitrogen, argon, helium, or a combination thereof) and does not necessarily contain "air." An "air gap" may be, but is not necessarily, a void (e.g., an unfilled volume, a vacuum).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIGS. 1A through 1F illustrate a method of forming an apparatus including a device structure (e.g., a microelectronic device structure) including air gaps between conductive lines (e.g., data lines, also referred to as bit lines), at various stages of the method, according to an embodiment of this disclosure. For simplicity, the formation of a single device structure is illustrated, but it will be understood by one of ordinary skill in the art that the method may include simultaneously forming multiple (e.g., more than one, an array of) device structures. For convenience in describing FIGS. 1A through 1F, a first direction may be defined as a direction, shown in FIGS. 1A through 1F, as the X-direction, a second direction, which is transverse (e.g., perpendicular) to the first direction, may be defined as the Y-direction, and a third direction, which is transverse (e.g., perpendicular) to each of the first direction and the second direction, may be defined as the Z-direction. Similar directions are defined, as shown in FIG. 2, as discussed in greater detail below.

Figure 2:
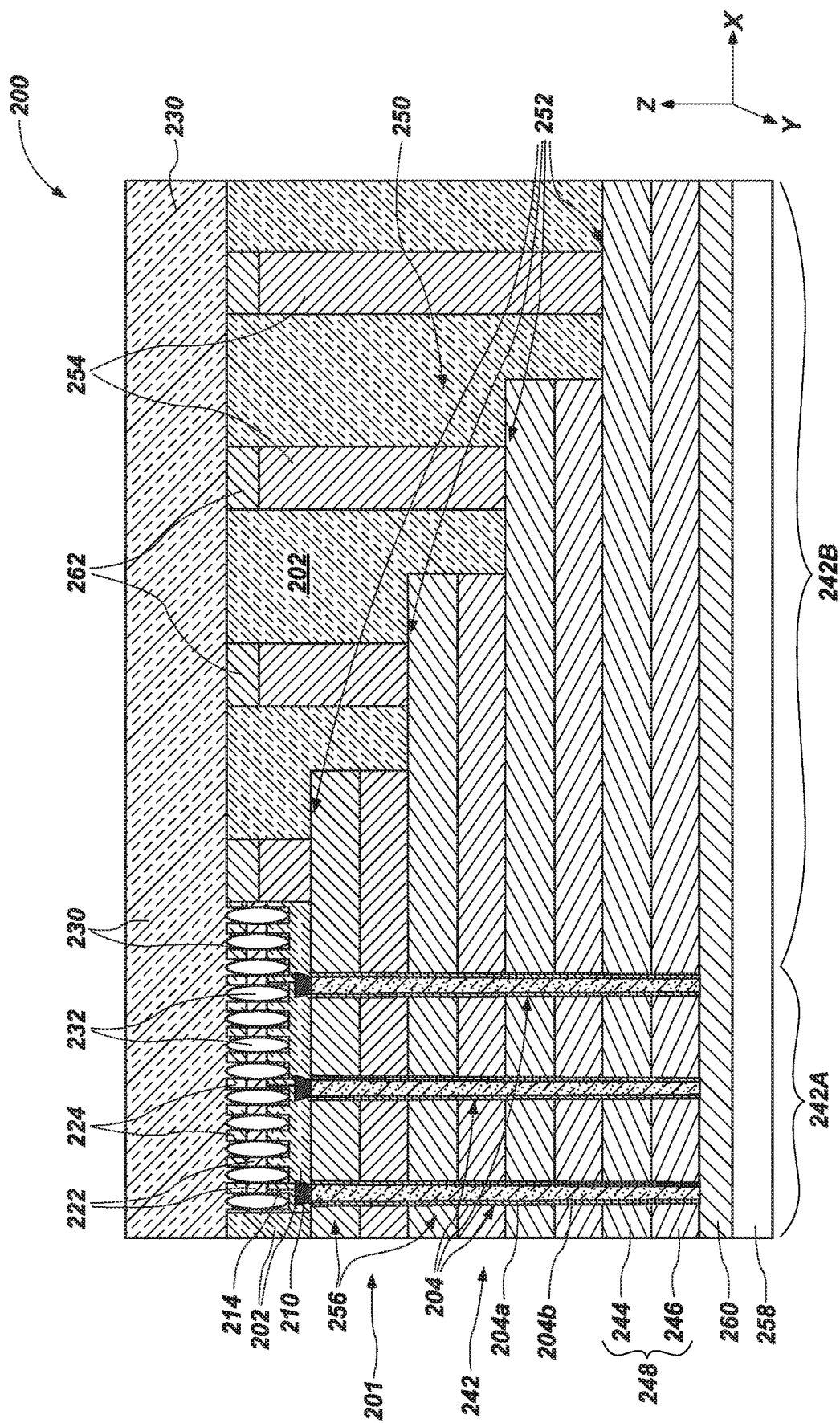
FIG. 2 is a simplified partial cross-sectional view of the apparatus of FIGS. 1A through 1F, in accordance with embodiments of the disclosure.

Referring to FIG. 1A, a partially fabricated device structure 100 for use in an apparatus (e.g., a microelectronic device, a memory device) is shown. The partially fabricated device structure 100 at the process stage shown in FIG. 1A may be formed by conventional techniques, which are not described in detail herein. The device structure 100 includes a first isolation material 102 overlying a base material (not shown). In some embodiments, the first isolation material 102 includes a single insulative material (e.g., a dielectric material). In other embodiments, the first isolation material 102 includes a stack of alternating materials. For example, the stack of alternating materials may include alternating tiers of a first dielectric material and a second dielectric material that differ from one another. At least some of the alternating tiers of the dielectric materials of the first isolation material 102 may have been replaced with a conductive material prior to forming the device structure 100. Therefore, the stack of alternating materials may include alternating dielectric materials and conductive materials.

The first isolation material 102 (e.g., insulative structures of the stack of alternating materials) may be formed of and include at least one dielectric material, such as one or more of a dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), a dielectric nitride material (e.g., $SiN_y$), a dielectric oxynitride material (e.g., $SiO_xN_y$), and a dielectric carboxynitride material (e.g., $SiO_xC_zN_y$). In some embodiments, the first isolation material 102 is formed of and includes Sift. The first isolation material 102 may be formed using one or more conventional deposition techniques, including, but not limited to one or more of a conventional CVD process or a conventional ALD process.

As shown in FIG. 1A, pillar structures 104 may extend vertically through the first isolation material 102. The pillar structures 104 may be formed in an array region and may be configured as memory pillar structures (e.g., channel pillar structures). The pillar structures 104 may exhibit a substantially rectangular cross-sectional shape (e.g., a substantially square cross-sectional shape). However, the disclosure is not so limited. As a non-limiting example, in additional embodiments, the pillar structures 104 exhibit a substantially circular cross-sectional shape. In addition, a pitch between horizontally adjacent pillar structures 104 may be within a range of from about 50 nm to about 200 nm, such as from about 50 nm to about 100 nm, from about 100 nm to about 150 nm, or from about 150 nm to about 200 nm. In some embodiments, a critical dimension of the individual pillar structures 104 in a horizontal direction is within a range of from about 20 nm to about 200 nm, such as from about 20 nm to about 50 nm, from about 50 nm to about 100 nm, from about 100 nm to about 150 nm, or from about 150 nm to about 200 nm, for example.

The pillar structures 104 may be formed in openings vertically extending (e.g., in the Z-direction) through the first isolation material 102. For example, the pillar structures 104 may be formed in high aspect ratio (HAR) openings, such as having an aspect ratio of at least about 20:1, at least about 40:1, at least about 50:1, at least about 60:1, at least about 80:1, or at least about 100:1. In some embodiments, the openings of the pillar structures 104 may have an aspect ratio within a range of from about 20:1 to about 40:1. Individual pillar structures 104 include a channel material of cell film 104a surrounding a fill material 104b. For example, the cell film 104a may include a cell material formed within the openings, and a channel material formed adjacent (e.g., over) the cell material. For convenience, the cell material and channel material are illustrated as a single material (e.g., the cell film 104a) in FIG. 1A. However, the cell film 104a is understood to include both the cell material and the channel material. The cell material and channel material are formed by conventional techniques, such as by CVD or ALD. The cell material may, for example, be an oxide-nitride-oxide (ONO) material, such as a silicon oxide-silicon nitride-silicon oxide material, that is conformally formed over sidewalls of the pillar structures 104. The cell material may be formed at a smaller relative thickness than the channel material. The channel material may be conformally formed adjacent (e.g., over) the cell material. The channel material may, for example, be polysilicon. The fill material 104b may be formed adjacent (e.g., over) the channel material of the cell films 104a, substantially filling the openings. The fill material 104b may be an insulative material, such as a high quality silicon oxide material. For example, the fill material 104b may be a highly uniform and highly conformal silicon oxide material (e.g., a highly uniform and highly conformal silicon dioxide material). The fill material 104b may be highly uniform and highly conformal as deposited. The fill material 104b may be formed by conventional techniques, such as by ALD. In some embodiments, the fill material 104b is an ALD $SiO_x$. The fill material 104b may initially be formed in the openings and over exposed horizontal surfaces of the first isolation material 102, with the fill material 104b over the first isolation material 102 subsequently removed, such as by an abrasive planarization process (e.g., chemical mechanical planarization (CMP)). Accordingly, the fill material 104b is surrounded by the cell material and the channel material of the cell film 104a. At least portions of the cell film 104a and the fill material 104b of the pillar structures 104 may be operatively coupled (e.g., electrically connected) to a source structure underlying the first isolation material 102, as described in further detail below with reference to FIG. 2.

With continued reference to FIG. 1A, conductive plug structures 106 (e.g., a drain contact plug material) may be formed within upper portions of the pillar structures 104. The conductive plug structures 106 may be formed adjacent to (e.g., on or over) the fill material 104b and inwardly laterally adjacent to the channel material of the cell film 104a. The conductive plug structures 106 may be electrically coupled to the channel material of the cell film 104a. The conductive plug structures 106 may comprise a semiconductor material, such as one or more of polysilicon, silicon germanium, and germanium. The conductive plug structures 106 may be conductively doped. The process for forming the conductive plug structures 106 may be, for example, CVD or ALD.

Contact structures 110 (e.g., contacts, bit line contacts) may be formed adjacent to (e.g., on or over) uppermost surfaces of the conductive plug structures 106. The contact structures 110 may be formed using one or more conventional processes (e.g., conventional deposition processes, conventional material removal processes) and conventional processing equipment, which are not described in detail herein. For example, portions of a dielectric material (e.g., the first isolation material 102) overlying the conductive plug structures 106 may be removed (e.g., through a conventional photolithographic patterning and etching process) to form a plug opening overlying the conductive plug structures 106, a conductive material may be deposited into the plug opening, and the portions of the conductive material may be removed (e.g., through a CMP process) to form the contact structures 110.

The contact structures 110 may be formed of and include at least one electrically conductive material, such as one or more of a metal, an alloy, a conductive metal oxide, a conductive metal nitride, a conductive metal silicide, and a conductively doped semiconductor material. By way of non-limiting example, the contact structures 110 may be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide (TiSix), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), and conductively doped silicon. In some embodiments, the contact structures 110 are formed of and include tungsten (W).

Outer side surfaces (e.g., sidewalls) of the contact structures 110 may exhibit a tapered profile with an upper portion of individual contact structures 110 having a greater critical dimension (e.g., width) than a lower portion thereof, as shown in FIG. 1A. In other embodiments, the contact structures 110 have a different profile, for example, a substantially orthogonal (e.g., substantially rectangular) profile, a dish-shaped profile, or any other three-dimensional recess shape, such that at least portions (e.g., a lateral extent of upper surfaces 112) of the contact structures 110 extend beyond sidewalls of the pillar structures 104 in at least one lateral direction (e.g., the X-direction). An additional portion of the dielectric material, collectively referred to as the first isolation material 102, may be formed adjacent to (e.g., on or over) the upper surfaces 112 of the contact structures 110.

Figure 1B:
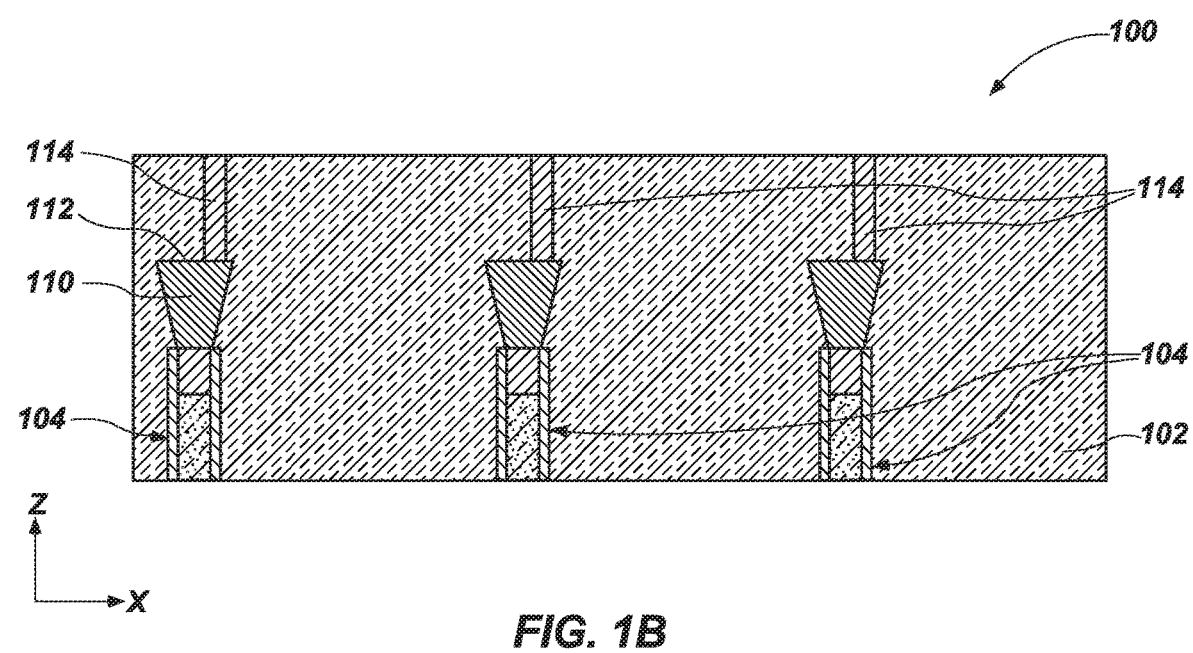

Referring next to FIG. 1B, interconnect structures 114 (e.g., contact vias, bit line vias) may be formed adjacent to (e.g., on or over) the upper surfaces 112 of the contact structures 110. The interconnect structures 114 may be formed using one or more conventional processes (e.g., conventional deposition processes, conventional material removal processes) and conventional processing equipment, which are not described in detail herein. For example, portions of the first isolation material 102 overlying the contact structures 110 may be removed (e.g., through a conventional photolithographic patterning and etching process) to form via openings overlying the upper surfaces 112 of the contact structures 110, a conductive material may be deposited into the via openings, and the portions of the conductive material may be removed (e.g., through a CMP process) to form the interconnect structures 114.

The interconnect structures 114 may be formed through a damascene process without using one or more subtractive patterning (e.g., etching) processes. In some embodiments, the interconnect structures 114 are formed using a single damascene process, in which portions of the first isolation material 102 may be selectively removed to expose respective portions of the upper surfaces 112 of the contact structures 110 and to form the via openings extending through the first isolation material 102. The via openings are defined by sidewalls of the first isolation material 102 and may be formed by conventional photolithography techniques. One or more dry etch processes may be used to form the via openings. The conductive material of the interconnect structures 114 may be formed within the via openings using chemical vapor deposition (CVD) or physical vapor deposition (PVD), for example. The interconnect structures 114 may, alternatively, or additionally, be formed using selective CVD deposition using conventional techniques. Thereafter, upper portions of the interconnect structures 114 above an upper surface of the first isolation material 102 may be removed (e.g., by CMP processing).

In additional embodiments, the interconnect structures 114 are formed during formation of the contact structures 110. For example, the interconnect structures 114 may be formed substantially simultaneously with the formation of the contact structures 110 in order to simplify manufacturing processes. In other words, a conductive material of each of the contact structures 110 and the interconnect structures 114 may be deposited to substantially fill extended openings in the first isolation material 102 in a single deposition act. In such embodiments, outer side surfaces (e.g., sidewalls) of the interconnect structures 114 are initially formed to exhibit a tapered profile with an upper portion of individual interconnect structures 114 having a greater critical dimension (e.g., width) than a lower portion thereof and/or having a greater critical dimension (e.g., width) than the contact structures 110. For instance, the interconnect structures 114 may initially be formed to exhibit a lateral extent greater than a lateral extent of the contact structures 110. Portions of the outer side surfaces of the initial material of the interconnect structures 114 may be removed (e.g., etched) in one or more material removal processes such that a final dimension (e.g., final width) of the interconnect structures 114 is relatively less than that of the contact structures 110, as discussed in greater detail with reference to FIG. 1F.

The interconnect structures 114 may be configured to be positioned over (e.g., in direct vertical alignment with) the contact structures 110 such that at least a portion of the outer side surfaces of each of the interconnect structures 114 and the contact structures 110 are aligned with one another. In other words, the outer side surfaces of each of the interconnect structures 114 and the contact structures 110 may be elongated, continuous portions of a conductive material along at least one side thereof. As shown in FIG. 1B, the interconnect structures 114 may be laterally offset (e.g., positioned off-center or staggered) in order to facilitate electrical connection with the contact structures 110.

The interconnect structures 114 may be formed of and include at least one electrically conductive material, such as one or more of a metal, an alloy, a conductive metal oxide, a conductive metal nitride, a conductive metal silicide, and a conductively doped semiconductor material. By way of non-limiting example, the interconnect structures 114 may be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide (Ti Six), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), and conductively doped silicon. In some embodiments, the interconnect structures 114 is formed of and includes tungsten (W). The interconnect structures 114 may or may not include substantially the same material composition as the contact structures 110.

Figure 1C:
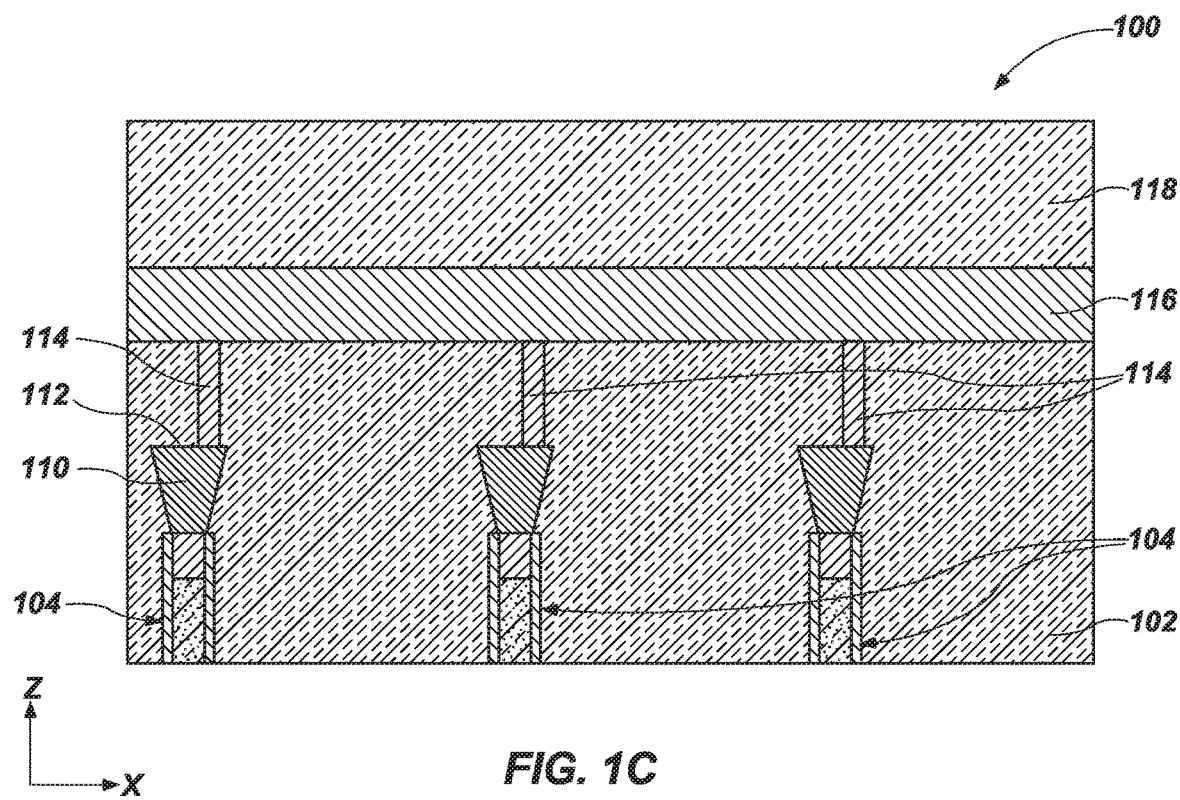

Referring to FIG. 1C, a conductive material 116 may be formed adjacent to (e.g., on or over) upper surfaces of each of the first isolation material 102 and the interconnect structures 114. The conductive material 116 may be formed using one or more conventional deposition processes, such as one or more of a conventional ALD process, a conventional CVD process, and a conventional PVD process. For example, the conductive material 116 may be formed to exhibit a substantially continuous, flat material surface over upper surfaces of the first isolation material 102 and over exposed upper surfaces of the interconnect structures 114. In other words, the conductive material 116 may be formed as a substantially continuous portion of material, without separation and without being formed in openings (e.g., trenches) in the first isolation material 102. The conductive material 116 may be substantially planar, and may exhibit a desired thickness of subsequently formed conductive lines, as described in greater detail with reference to FIG. 1D. By initially forming the conductive material 116 as a continuous portion of the conductive material, the subsequently formed conductive lines (e.g., data lines, bit lines) may be formed without using one or more damascene processes, such as a single-damascene process or a dual-damascene process.

The conductive material 116 may be formed of and include at least one electrically conductive material, such as one or more of a metal, an alloy, a conductive metal oxide, a conductive metal nitride, a conductive metal silicide, and a conductively doped semiconductor material. By way of non-limiting example, the conductive material 116 may be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide (Ti Six), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), and conductively doped silicon. In some embodiments, the conductive material 116 is formed of and includes tungsten (W). The conductive material 116 may or may not include substantially the same material composition as the contact structures 110 and/or the interconnect structures 114.

With continued reference to FIG. 1C, a dielectric material 118 may be formed adjacent to (e.g., on or over) upper surfaces of the conductive material 116. The dielectric material 118 may be selectively etchable relative to the conductive material 116 and/or the subsequently formed materials during common (e.g., collective, mutual) exposure to a first etchant, and the conductive material 116 and/or the subsequently formed materials may be selectively etchable relative to the dielectric material 118 during common exposure to a second, different etchant.

In some embodiments, the dielectric material 118 may also function as a mask material (e.g., a mask, a resist material, an anti-reflective coating). The dielectric material 118 may also be referred to herein as a hard mask. By way of non-limiting example, the dielectric material 118 may be formed of and include at least one of amorphous carbon, silicon, a silicon oxide, a silicon nitride, a silicon oxycarbide, aluminum oxide, and a silicon oxynitride. In some embodiments, the dielectric material 118 is formed of and includes at least one dielectric oxide material (e.g., one or more of silicon dioxide and aluminum oxide). In other embodiments, the dielectric material 118 is formed of and includes silicon nitride. The dielectric material 118 may be homogeneous (e.g., may include a single material), or may be heterogeneous (e.g., may include a stack including at least two different materials). The dielectric material 118 may be formed using one or more conventional processes (e.g., conventional deposition processes) and conventional processing equipment, which are not described in detail herein. For example, the dielectric material 118 may be deposited (e.g., through one or more of CVD, PVD, ALD, spin-coating) over upper surfaces of the conductive material 116. In some embodiments, the dielectric material 118 is formed to have an initial height that is greater than a final height of dielectric structures 124 (FIG. 1D) formed from the dielectric material 118 in order to achieve a desired height of individual portions (e.g., individual structures) thereof following subsequent processing acts, as described in further detail below.

Figure 1D:
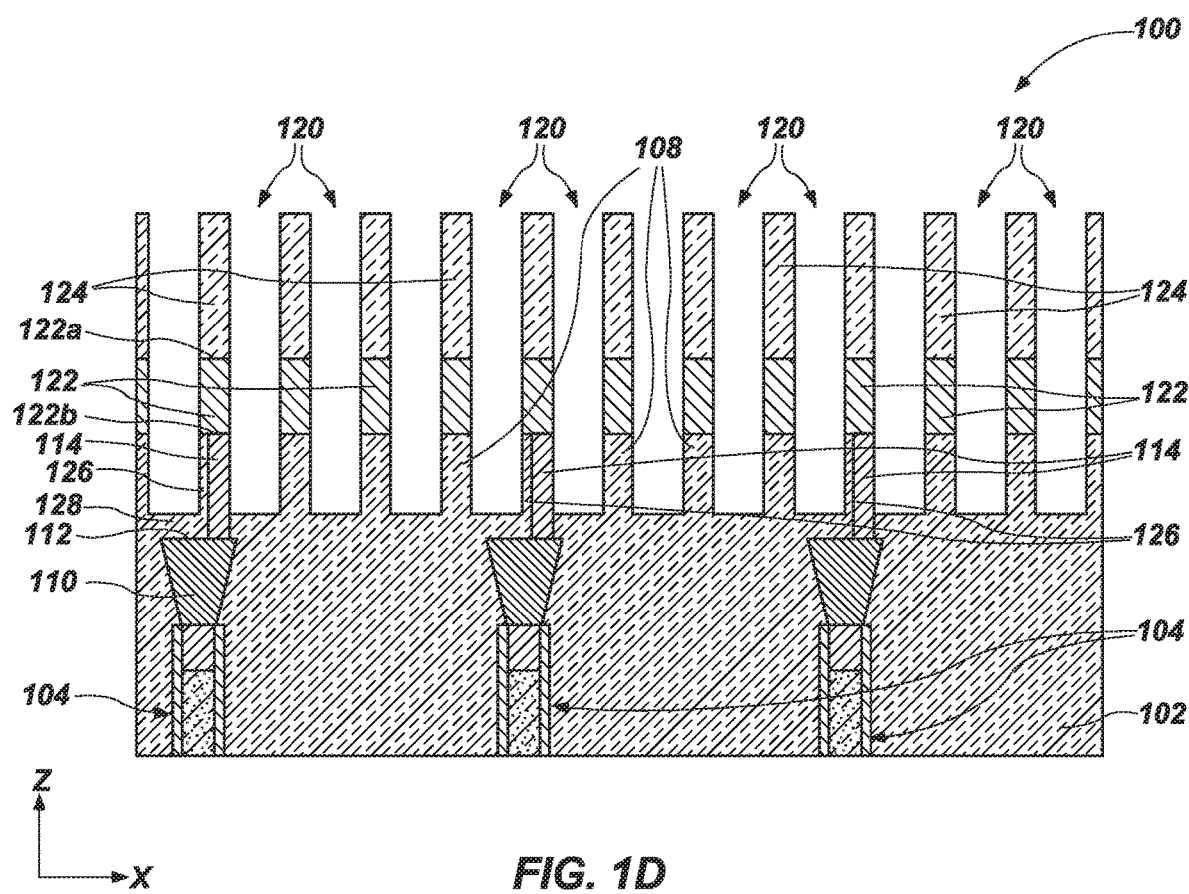

Referring next to FIG. 1D, the device structure 100 may be patterned to form openings 120 having elongated portions extending in the second direction (e.g., the Y-direction). The openings 120 may vertically extend (e.g., in the Z-direction) through each of the dielectric material 118 (FIG. 1C), the conductive material 116 (FIG. 1C), and at least a portion of the first isolation material 102. For example, the openings 120 may be formed by transferring a pattern of openings and features of the dielectric material 118 into the conductive material 116 overlying the first isolation material 102. The patterned dielectric material 118 may be used to selectively remove (e.g., selectively etch, selectively dry etch) the underlying materials in one or more etch processes (e.g., a single etch process) to form the openings 120. The openings 120 may be formed to have a desired depth that may be selected at least partially based on a desired height of air gaps to be formed through subsequent processing of the device structure 100, as described in further detail below with reference to FIG. 1E.

In some embodiments, portions of each of the dielectric material 118 (FIG. 1C), the conductive material 116 (FIG. 1C), and the first isolation material 102 are removed by exposing the respective materials to wet etch and/or dry etch chemistries, for example, in one or more material removal processes. Formation of the openings 120 may be used to separate the conductive material 116 into individual portions to form conductive lines 122 (e.g., data lines, bit lines) having elongated portions extending in the second direction, and to separate the dielectric material 118 into individual portions (e.g., segments) to form the dielectric structures 124 overlying the conductive lines 122 and having elongated portions extending in the second direction. The conductive lines 122 include upper surfaces 122a that are vertically adjacent to the dielectric structures 124 and lower surfaces 122b that are vertically adjacent to the first isolation material 102. Accordingly, the openings 120 may be located horizontally adjacent to each of the dielectric structures 124, the conductive lines 122, and portions of the first isolation material 102. Formation of the openings 120 may also separate remaining portions of the first isolation material 102 underlying the conductive lines 122 into segments 108. In other words, remaining portions of the first isolation material 102 vertically adjacent (e.g., underlying) the conductive lines 122 and separated on both lateral sides (e.g., in the Y-direction) by the openings 120 are designated as the segments 108 of the first isolation material 102, as shown in FIG. 1D. By controlling the amount of material removal that occurs, the openings 120 may extend into a portion of the first isolation material 102, enabling air gaps 132 (FIG. 1E) to be subsequently formed adjacent to the dielectric structures 124, the conductive lines 122, and the segments 108 of the first isolation material 102.

To form the openings 120, the device structure 100 (at the processing stage depicted in FIG. 1D) may be disposed in a conventional semiconductor tool (e.g., a single chamber of a material removal device, an etch device). The device structure 100 may be exposed to one or more etchants using conventional processes (e.g., spin-coating process, a spray-coating process, an immersion-coating process, a vapor-coating process, a soaking process, combinations thereof) and conventional processing equipment, which are not described in detail herein. A total depth of the openings 120 may substantially correspond to the final height of the dielectric material 118, plus the height of the conductive material 116, plus the height of the segments 108 of the first isolation material 102. Similarly, the height of the air gaps 132 may substantially correspond to the height of the dielectric structures 124, plus the height of the conductive lines 122, plus the height of the segments 108 of the first isolation material 102. Since a thickness of the dielectric material 118 (FIG. 1C) may be reduced during formation of the openings 120 as a result of the one or more material removal acts, the dielectric material 118 may be initially be formed to have an initial height (e.g., thickness) that is greater than the final height of the dielectric structures 124 formed from the dielectric material 118 in order to achieve a desired height of the dielectric structures 124.

Forming the openings 120 includes subtractive patterning of the device structure 100 of FIG. 1C to form the conductive lines 122 extending in the second direction (e.g., the Y-direction) as well as the dielectric structures 124 overlying the conductive lines 122 and the segments 108 underlying the conductive lines 122. The openings 120 may be formed, for example, by providing an etch mask pattern including one or more of a resist, a hard mask and an anti-reflective coating. For instance, the resist may be patterned by a photolithography process, and the pattern may be transferred into an underlying hard mask and/or antireflective layers. Alternative lithographic techniques are also possible, including processes without hard mask layers. If one or more hard mask layers are included, the resist may be removed prior to using the hard mask during etch of underlying materials. Thus, the etch mask pattern may be provided by resist and/or hard mask layers at the time of transferring the pattern into the underlying materials. In some instances, the etch mask pattern blocks areas covered by the mask pattern to protect the underlying materials from being etched (e.g., wet or dry), while the etch mask pattern exposes areas not covered by the mask pattern to etch the exposed region of the materials to be etched.

In some embodiments, the subtractive patterning process is conducted in one or more (e.g., a single) material removal act in a single chamber of a conventional semiconductor tool (e.g., a material removal device, an etch device). Since the openings 120 may be formed through the dielectric material 118, the conductive material 116, and the first isolation material 102 by a single etch act, the openings 120 extend in a vertical direction adjacent to (laterally adjacent to) the dielectric structures 124, the conductive lines 122, and the segments 108 of the first isolation material 102. By utilizing the subtractive process, the openings 120 and the conductive lines 122 may be formed without using one or more damascene processes and without forming additional materials adjacent to (e.g., underlying) the conductive lines 122, which would be needed to facilitate a damascene process, for example. Conventional device structures often include another material, such as an etch stop material (e.g., a nitride material), located between conventional conductive lines (e.g., bit lines) and conventional isolation materials (e.g., an oxide material). Such nitride materials are often located adjacent to conventionally formed bit line vias and may be characterized as so-called "nitride stop-etch" materials. According to embodiments of the disclosure, the interconnect structures 114 may be formed laterally adjacent to the first isolation material 102 (e.g., an oxide material) without being laterally adjacent a nitride material. Accordingly, forming the openings 120 and the conductive lines 122 of the device structure 100 using the subtractive patterning process provides an improvement over conventional processes (e.g., single damascene processes) by enabling the openings 120 to be formed to a desired depth by a single process act, thus eliminating process acts while avoiding unnecessary waste of additional isolation materials (e.g., the nitride material). The interconnect structures 114 may be located directly between and operatively coupled with the contact structures 110 and the conductive lines 122.

In some embodiments, at least portions of the interconnect structures 114 may be removed during the subtractive patterning process. In such embodiments, the dielectric structures 124 and/or the conductive lines 122 are formed to be self-aligned with the underlying conductive materials (e.g., the interconnect structures 114) using a so-called "assisted self-alignment" process. Accordingly, the dielectric structures 124 and the conductive lines 122 may be located over (e.g., in direct vertical alignment with) the interconnect structures 114 such that one of the outer side surfaces of each of the dielectric structures 124, the conductive lines 122, and the interconnect structures 114 are vertically aligned with one another. In other words, the outer side surfaces of each of the dielectric structures 124, the conductive lines 122, and the interconnect structures 114 may be in direct vertical alignment along at least one side thereof. Alternatively, or additionally, at least some of the outer side surfaces of the interconnect structures 114 may be adjacent to first residual portions 126 (e.g., remaining portions) of the first isolation material 102 laterally adjacent (e.g., between) the interconnect structures 114 and the openings 120 in a first direction (e.g., the X-direction).

The openings 120 may vertically extend from upper surfaces of the dielectric structures 124 to the first isolation material 102, without extending to upper vertical boundaries (e.g., the upper surfaces 112) of the contact structures 110. Accordingly, a lower portion of the outer side surfaces of the interconnect structures 114 may be laterally adjacent second residual portions 128 (e.g., remaining portions) of the first isolation material 102 located vertically adjacent (e.g., between) the conductive lines 122 and the upper surfaces 112 of the contact structures 110 in the vertical direction (e.g., the Z-direction). Stated another way, remaining portions of the first isolation material 102 (e.g., the first residual portions 126 and the second residual portions 128) may form an "L-shaped" structure of the first isolation material 102 proximate the upper surfaces 112 of the contact structures 110 and the interconnect structures 114, and defining at least some of the openings 120 on at least two consecutive sides. The first residual portions 126 and the second residual portions 128 may protect the contact structures 110 and the interconnect structures 114 from subsequently conducted process acts, such as material removal acts.

Individual pillar structures 104, along with corresponding individual contact structures 110 and individual interconnect structures 114, are associated with a single (e.g., one) of the conductive lines 122. For clarity and ease of understanding the drawings and associated description, additional pillar structures 104, along with the corresponding individual contact structures 110 and individual interconnect structures 114, are absent in FIG. 1D. In other words, each of three (3) additional pillar structures 104 of each set of four (4) of the pillar structures 104 is positioned half a pitch deeper into the plane of the page from the perspective of FIG. 1D (e.g., in the Y-direction) and are associated with three (3) of the conductive lines 122 of each set of four (4) of the conductive lines 122. However, the disclosure is not so limited, and additional configurations of the pillar structures 104, the contact structures 110, the interconnect structures 114, and the conductive lines 122 may be contemplated.

Figure 1E:
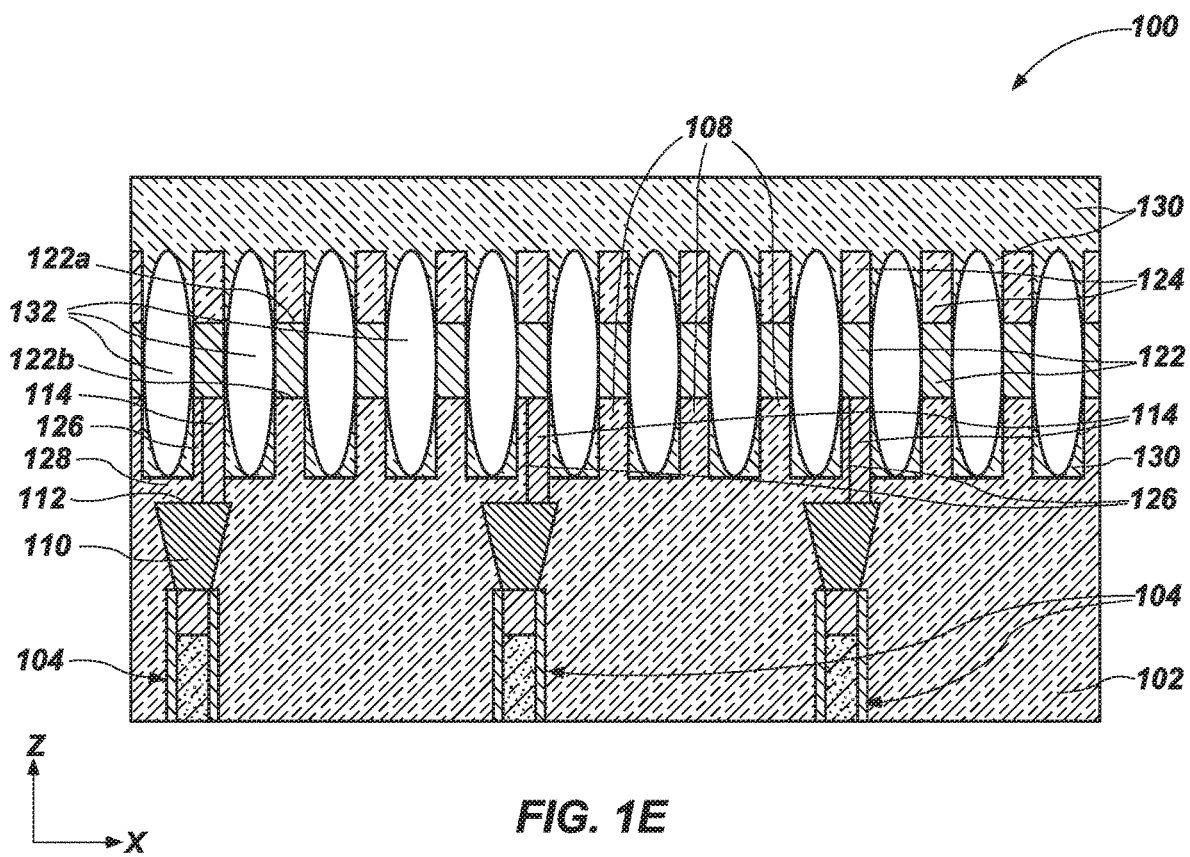

Referring next to FIG. 1E, a second isolation material 130 may be formed adjacent to (e.g., on or over) exposed upper surfaces of the dielectric structures 124 to substantially cover the openings 120 and the dielectric structures 124. A portion of the second isolation material 130 may be formed in the openings 120, such as on sidewalls of the dielectric structures 124, the conductive lines 122, and the segments 108. However, a majority of a volume of the openings 120 may be substantially free of the second isolation material 130. The second isolation material 130 may be formed proximate a top end of the openings 120 to seal unfilled spaces in a central portion therein, forming one or more of the air gaps 132 (e.g., voids, unfilled volumes) within the central portion of the openings 120. In some embodiments, at least some of the air gaps 132 include a gaseous material (e.g., air, oxygen, nitrogen, argon, helium, or a combination thereof). In other embodiments, the air gaps 132 include a vacuum (e.g., a space entirely void of matter). The air gaps 132 are defined by portions of the second isolation material 130 within the openings 120 and adjacent to (e.g., over) the openings 120. An upper surface of the air gaps 132 is defined by a lower surface of the second isolation material 130 over the openings 120. A lower surface of the air gaps 132 is defined by a surface of the first isolation material 102 within the openings 120, such as a horizontal surface of the first isolation material 102 at the bottom of the openings 120. Sidewalls of the air gaps 132 are defined by the second isolation material 130 within the openings 120, such as on the sidewalls of the dielectric structures 124, the conductive lines 122, and the segments 108 of the first isolation material 102. As shown in more detail in FIG. 1F, the air gaps 132 have a height $H_3$ that extends from the upper surface of the dielectric structures 124 to the surface of the first isolation material 102 at the bottom of the openings 120.

The air gaps 132 are laterally adjacent to the dielectric structures 124, the conductive lines 122, and the first residual portions 126 of the first isolation material 102. For example, the air gaps 132 are laterally adjacent to the conductive lines 122, with a portion of the air gaps 132 extending above a plane of the upper surface 122a of the laterally adjacent conductive lines 122 (e.g., laterally adjacent the dielectric structures 124) and a portion of the air gaps 132 extending below a plane of the lower surface 122b of the laterally adjacent conductive lines 122 (e.g., laterally adjacent the interconnect structures 114 and/or segments of the first isolation material 102). In other words, one or more (e.g., a single one) of the air gaps 132 extends between laterally neighboring conductive lines 122 with a vertical extent of the air gaps 132 being beyond (e.g., vertically above and vertically below) a vertical extent of the conductive lines 122. Since a portion of the air gaps 132 extends above the midpoint of the air gaps 132 and a portion of the air gaps 132 extends below the midpoint of the air gaps 132 of the conductive lines 122, the air gaps 132 may laterally intervene between adjacent conductive lines 122 and may exhibit a height in the vertical direction that is relatively greater than a height of the conductive lines 122, as described in greater detail with reference to FIG. 1F.

The air gaps 132 may be formed in the central portion of the openings 120 and substantially extend through a height of the openings 120 following formation of the second isolation material 130. Elongated portions of the air gaps 132 may extend in the second direction (e.g., the Y-direction) with at least a portion of the air gaps 132 being located immediately adjacent to the conductive lines 122. Further, the air gaps 132 may be in direct vertical alignment with at least a portion of the contact structures 110, such that at least portions of the air gaps 132 are located directly over (e.g., vertically aligned with) portions of the contact structures 110. In some instances, the air gaps 132 may function as an insulator material having a dielectric constant (k) of about 1. The air gaps 132 may limit capacitance (e.g., parasitic capacitance, stray capacitance) and increase shorts margin between laterally-neighboring conductive lines 122, and may reduce cross-talk therebetween.

In some embodiments, portions of the second isolation material 130 may be formed within the openings 120 and adjacent to side surfaces (e.g., sidewalls) of the dielectric structures 124, the conductive lines 122, and/or the segments 108 of the first isolation material 102. The second isolation material 130 may also contact surfaces of the first isolation material 102 within a bottom portion of the openings 120. In other words, at least portions of the second isolation material 130 may be formed in the openings 120 and adjacent to (e.g., laterally adjacent to) the dielectric structures 124 and the first residual portions 126, as shown in FIG. 1E. Accordingly, at least a portion of the second isolation material 130 is laterally adjacent the first isolation material 102, in some embodiments. In other embodiments, at least some (e.g., each of) the openings 120 are substantially devoid (e.g., substantially absent, substantially entirely free) of the second isolation material 130 such that a lower vertical boundary of the second isolation material 130 is located at or above the upper surface of the dielectric structures 124 without any of the second isolation material 130 being located within the openings 120. The air gaps 132 within the openings 120 may be configured (e.g., sized, shaped, etc.) to reduce parasitic (e.g., stray) capacitance between adjacent conductive lines 122. In some embodiments, the air gaps 132 exhibit a substantially rectangular profile in at least one horizontal direction (e.g., the X-direction), such as when the openings 120 are devoid of the second isolation material 130. In other embodiments, the air gaps 132 exhibit a substantially dish-shaped profile, such as a "V-shaped" profile or a "U-shaped" profile, in embodiments including portions of the second isolation material 130 within the openings 120. In yet other embodiments, the air gaps 132 exhibit a substantially tapered (e.g., a frustum, an inverted frustum, a substantially Y-shaped) profile or a so-called "hourglass" (e.g., a concave bow) profile, for example.

The second isolation material 130 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the second isolation material 130 is formed of and includes Sift. In other embodiments, the second isolation material 130 is formed of and includes a low-k dielectric material. The second isolation material 130 may or may not include substantially the same material composition as the at least one dielectric material (e.g., insulative structures of the stack of alternating materials) of the first isolation material 102. The second isolation material 130 may be substantially homogeneous, or the second isolation material 130 may be heterogeneous. If the second isolation material 130 is heterogeneous, amounts of one or more elements included in the second isolation material 130 may vary stepwise (e.g., change abruptly), or may vary continuously (e.g., change progressively, such as linearly, parabolically) throughout different portions of the second isolation material 130. In some embodiments, the second isolation material 130 is substantially homogeneous. In further embodiments, the second isolation material 130 is heterogeneous. The second isolation material 130 may, for example, be formed of and include a stack (e.g., laminate) of at least two different dielectric materials.

The second isolation material 130 may be formed using conventional processes (e.g., conventional deposition processes, such as one or more of spin-on coating, blanket coating, CVD and PVD; conventional material removal processes, such as a conventional CMP process) that achieve the air gaps 132 and conventional processing equipment, which are not described in detail herein. For example, the second isolation material 130 may be formed on or over portions of the exposed surfaces of the dielectric structures 124 using one or more conventional non-conformal deposition processes (e.g., at least one conventional non-conformal PVD process). Thereafter, the second isolation material 130 may be subjected to at least one conventional planarization process (e.g., at least one conventional CMP process) to facilitate or enhance the planarity of an upper boundary (e.g., upper surface) of the second isolation material 130. The dielectric structures 124 may remain in the device structure 100 following formation of the second isolation material 130 in order to facilitate formation of the air gaps 132 adjacent to the conductive lines 122. By using the dielectric material 118 (FIG. 1C) of the dielectric structures 124 as a mask during the subtractive patterning process and by allowing formation of the air gaps 132 adjacent to the conductive lines 122, the dielectric structures 124 serves more than one (e.g., a dual) purpose by allowing the device structure 100 to be formed utilizing fewer process acts and fewer materials than conventional device structures.

Figure 1F:
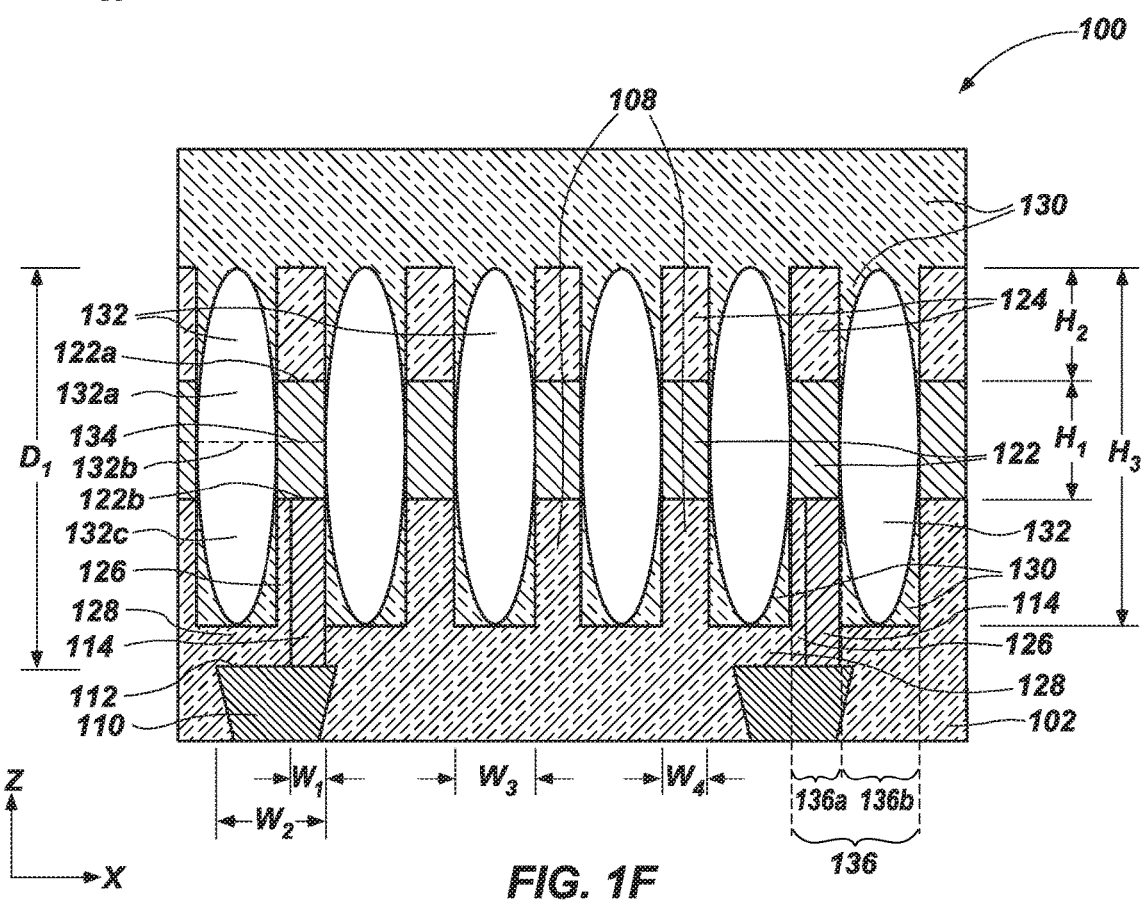

FIG. 1F is an enlarged view of a portion of the device structure 100 of FIG. 1E. As shown in FIG. 1F, individual air gaps 132 may include an upper portion 132a, a central portion 132b (e.g., a midpoint), and a lower portion 132c. The upper portion 132a is separated from the lower portion 132c, for illustrative purposes, by the central portion 132b. The central portion 132b may be laterally adjacent to the midpoint 134 (e.g., a half-way point in the vertical direction) of the conductive lines 122, with a portion of the air gaps 132 extending above the central portion 132b of the air gaps 132 and a portion of the air gaps 132 extending below the central portion 132b of the air gaps 132 relative to the vertical midpoint 134 of the conductive lines 122. In some embodiments, a height of the upper portion 132a and the lower portion 132c are substantially the same, such that a height in the vertical direction of the upper portion 132a of the air gaps 132 is substantially the same as (e.g., substantially equal to) a height in the vertical direction of the lower portion 132c of the air gaps 132.

While the device structure 100 is illustrated in FIG. 1F as comprising a particular (e.g., symmetric) orientation of the upper portion 132a and the lower portion 132c of the air gaps 132 relative to the vertical midpoint 134 of the conductive lines 122, such an arrangement is shown for illustrative purposes only and that any configuration of the device structure 100 including other (e.g., asymmetric) orientations of the upper portion 132a and the lower portion 132c of the air gaps 132 relative to the vertical midpoint 134 of the conductive lines 122 may be contemplated. For example, the upper portion 132a and the lower portion 132c may extend unequal heights above and below the central portion 132b such that the height of the upper portion 132a of at least some of the air gaps 132 is different than (e.g., substantially unequal to) the height of the lower portion 132c. For example, the height of the upper portion 132a may be greater than or, alternatively, less than the height of the lower portion 132c in at least some of the air gaps 132. The height of the upper portion 132a and of the lower portion 132c of the air gaps 132 relative to the central portion 132b may be due, at least in part, to a height of the dielectric structures 124 above the central portion 132b and to a height of the openings 120 within the first isolation material 102. The vertical orientation of the air gaps 132 may be tailored (e.g., selected) to meet design criteria of specific device structures.

The conductive material 116 (FIG. 1C) of the conductive lines 122, may be formed to have a desired height $H_1$. The height $H_1$ of the conductive material 116 may be selected at least partially based on a desired height of the conductive lines 122. By way of non-limiting example, the height $H_1$ of the conductive lines 122 may be within a range of from about 5 nm to about 50 nm, such as from about 5 nm to about 10 nm, from about 10 nm to about 20 nm, from about 20 nm to about 30 nm, from about 30 nm to about 40 nm, or from about 40 nm to about 50 nm.

The dielectric material 118 (FIG. 1C) of the dielectric structures 124, may be formed to have a desired height $H_2$. As discussed above with reference to FIG. 1D, the dielectric material 118 may initially be formed to have a greater height in order to achieve the desired height $H_2$ of the dielectric structures 124. The height $H_2$ of the dielectric structures 124 may be selected at least partially based on a desired vertical offset (e.g., in the Z-direction) between the conductive lines 122 and additional structures to be formed on or over the dielectric structures 124 through subsequent processing of the device structure 100. The height $H_2$ of the dielectric structures 124 may be selected at least partially based on a desired height of the air gaps 132 located between adjacent conductive lines 122 and extending above the central portion 132b. By way of non-limiting example, the height $H_2$ of the dielectric structures 124 may be within a range of from about 5 nm to about 50 nm, such as from about 5 nm to about 10 nm, from about 10 nm to about 20 nm, from about 20 nm to about 30 nm, from about 30 nm to about 40 nm, or from about 40 nm to about 50 nm. In some embodiments, the height $H_2$ of the dielectric structures 124 is substantially equal to the height $H_1$ of the conductive lines 122.

As discussed above with reference to FIG. 1E, the air gaps 132 are laterally adjacent to the conductive lines 122, with the upper portion 132a of the air gaps 132 extending above a plane of the upper surface 122a of the laterally adjacent conductive lines 122 (e.g., laterally adjacent the dielectric structures 124) and the lower portion 132c of the air gaps 132 extending below a plane of the lower surface 122b of the laterally adjacent conductive lines 122 (e.g., laterally adjacent the interconnect structures 114 and/or the segments 108 of the first isolation material 102). Accordingly, the upper portion 132a of individual air gaps 132 extends laterally adjacent the dielectric structures 124 and laterally adjacent an upper portion of the conductive lines 122 (e.g., above the vertical midpoint 134 thereof) and the lower portion 132c extends laterally adjacent the interconnect structures 114 and/or the segments 108 of the first isolation material 102 and laterally adjacent a lower portion of the conductive lines 122 (e.g., below the vertical midpoint 134 thereof). The openings 120 may be formed to have a desired height $H_3$. The height $H_3$ of the openings 120 may be selected at least partially based on a desired height of the air gaps 132 formed therein. In some embodiments, the height $H_3$ of the air gaps 132 corresponds to the height $H_3$ of the openings 120. By way of non-limiting example, the height $H_3$ of the openings 120 and, thus, the air gaps 132, may be within a range of from about 30 nm to about 200 nm, such as from about 30 nm to about 50 nm, from about 50 nm to about 100 nm, from about 100 nm to about 150 nm, or from about 150 nm to about 200 nm. In some embodiments, the height $H_3$ of the air gaps 132 is within a range of from about 50 nm to about 100 nm.

The height $H_3$ of the air gaps 132 may be relatively larger than the height $H_1$ of the conductive lines 122 or the height $H_2$ of the dielectric structures 124. Moreover, the height $H_3$ of the air gaps 132 may be relatively larger than the combined height of the height $H_1$ of the conductive lines 122 and the height $H_2$ of the dielectric structures 124, as shown in FIG. 1F. In some embodiments, the openings 120 have an aspect ratio (e.g., a high aspect ratio (HAR)) within a range of from between about 5:1 to about 40:1, such as between about 5:1 and about 10:1, between about 10:1 and about 20:1, or between about 20:1 and about 40:1. The height $H_3$ of the openings 120 and, thus, the air gaps 132 may be relatively less than a depth Di of the contact structures 110 within the device structure 100. The depth Di may correspond to a distance (e.g., in the Z-direction) between upper surfaces of the dielectric structures 124 and the upper surfaces 112 of the contact structures 110, such that at least some of the first isolation material 102 (e.g., the second residual portions 128 thereof) extends between the air gaps 132 and the upper surfaces 112 of the contact structures 110. In other words, the second residual portions 128 separate the air gaps 132 from the upper surfaces 112 of the contact structures 110.

With continued reference to FIG. 1F, the interconnect structures 114 may have a width $W_1$ (e.g., a horizontal dimension in the X-direction), and the contact structures 110 may have a width $W_2$ (e.g., taken from the upper surfaces 112 thereof) larger than the width $W_1$ of the interconnect structures 114. By way of non-limiting example, the width $W_1$ of the interconnect structures 114 may be within a range of from about 10 nm to about 100 nm, such as from about 10 nm to about 20 nm, from about 20 nm to about 30 nm, from about 30 nm to about 50 nm, or from about 50 nm to about 100 nm, and the width $W_2$ of the contact structures 110 may be within a range of from about 20 nm to about 200 nm, such as from about 20 nm to about 50 nm, from about 50 nm to about 100 nm, or from about 100 nm to about 150 nm, or from about 150 nm to about 200 nm. In some embodiments, the width $W_1$ of the interconnect structures 114 is within a range of from about 10 nm to about 50 nm, and the width $W_2$ of the contact structures 110 is within a range of from about 50 nm to about 150 nm.

The openings 120 and, thus, the air gaps 132 (e.g., at a greatest horizontal extent thereof) may have a width $W_3$, and the conductive lines 122 may have a width $W_4$ that is relatively less than the width $W_3$ of the air gaps 132. By way of non-limiting example, the width $W_3$ of the air gaps 132 may be within a range of from about 10 nm to about 100 nm, such as from about 10 nm to about 20 nm, from about 20 nm to about 30 nm, from about 30 nm to about 50 nm, or from about 50 nm to about 100 nm, and the width $W_4$ of the conductive lines 122 may be within a range of from about 10 nm to about 100 nm, such as from about 10 nm to about 20 nm, from about 20 nm to about 30 nm, from about 30 nm to about 50 nm, or from about 50 nm to about 100 nm. In some embodiments, the width $W_3$ of the air gaps 132 is within a range of from about 20 nm to about 100 nm, and the width $W_4$ of the conductive lines 122 is within a range of from about 10 nm to about 60 nm. Further, the width $W_3$ of the air gaps 132 may, for example, be within a range of from about 1 percent to about 500 percent (e.g., from about 10 percent to about 250 percent, from about 25 percent to about 125 percent, from about 50 percent to about 100 percent) larger than the width $W_4$ of the conductive lines 122. In other embodiments, the width $W_4$ of the conductive lines 122 is larger than or, alternatively, substantially equal to the width $W_3$ of the air gaps 132.

Further, a pitch 136 between horizontally adjacent conductive lines 122 may be within a range of from about 20 nm to about 200 nm, such as from about 20 nm to about 50 nm, from about 50 nm to about 100 nm, or from about 100 nm to about 200 nm. The pitch 136 includes a first width 136a corresponding to the width $W_4$ of the conductive lines 122 and a second width 136b corresponding to the width $W_3$ of the air gaps 132. In some embodiments, a ratio of the line width:space width (e.g., a ratio of the width of the conductive lines 122 to the width of the air gaps 132) is less than one (1). In other words, the width $W_4$ of the conductive lines 122 is relatively less than the width $W_3$ of the air gaps 132. Stated another way, the lateral extent of the conductive lines 122 in at least one horizontal direction (e.g., in the X-direction) is a fraction of that of the openings 120 and, thus, the air gaps 132. In some embodiments, the line:space ratio (e.g., the $W_4$:$W_3$ ratio) is substantially even (e.g., 1:1). In other embodiments, the line:space ratio is greater than 1:1 (e.g., 60:40, 70:30, or 80:20). The line:space ratio may be tailored to have a desired value between the width $W_4$ of the conductive lines 122 and the width $W_3$ of the air gaps 132 that may be selected at least partially based on design requirements of the device structure 100.

Numerous advantages are achieved by utilizing the processes (e.g., the subtractive patterning process of the conductive lines 122) described above to form the device structure 100. By using the subtractive process, a critical dimension (e.g., a width) of the conductive lines 122 may be relatively less than a critical dimension (e.g., a width) of the air gaps 132 laterally intervening therebetween, which reduces parasitic capacitance between the adjacent conductive lines 122. Since the openings 120 are laterally adjacent to the conductive lines 122, with a portion of the openings 120 extending above a plane of the upper surface 122a of the laterally adjacent conductive lines 122 (e.g., laterally adjacent the dielectric structures 124) and a portion of the openings 120 extending below a plane of the lower surface 122b of the laterally adjacent conductive lines 122 (e.g., laterally adjacent the dielectric structures 124 and the first isolation material 102), the air gaps 132 located within the openings 120 are laterally adjacent to the conductive lines 122, with a portion of the air gaps 132 extending above a plane of the upper surface 122a of the laterally adjacent conductive lines 122 and a portion of the air gaps 132 extending below a plane of the lower surface 122b of the laterally adjacent conductive lines 122, further reducing the parasitic capacitance between the adjacent conductive lines 122. The air gaps 132 according to embodiments of the disclosure may reduce the capacitance between neighboring conductive lines 122 by up to 65%. The reduced capacitance may, in turn, provide a reduced programming time of between about 5% and about 10%, in some instances. Extending the air gaps 132 below the conductive lines 122 also allows for reduced parasitic capacitance between laterally neighboring interconnect structures 114. Since the conductive lines 122 are formed by removing portions of the conductive material 116 (FIG. 1C), the formation of the air gaps 132 may be accomplished by removing not only portions of the conductive material 116 but also portions of the first insulation material 102 underlying the conductive material 116. Therefore, the subtractive process may be used to extend the depth of the openings 120, and of the subsequently formed air gaps 132, to below the conductive material 116. The subtractive patterning process of the conductive lines 122 further allows for the interconnect structures 114 to be self-aligned with the conductive lines 122, allowing for dimensions (e.g., pitch) between adjacent interconnect structures 114 to be further reduced.

Further, the air gaps 132 in the device structure 100 according to embodiments of the disclosure may enable low resistivity conductive materials to be used for the conductive lines 122. For instance, the subtractive patterning process allows the conductive lines 122 to be formed of and include a tungsten (e.g., tungsten nitride) material that is formed using a PVD process rather than being formed of a tungsten material that is formed using a CVD process. In addition, at least one critical dimension (e.g., a width, a height) of the conductive lines 122 may be relatively less than that of conventional conductive lines (e.g., bit lines) of conventional device structures by using the subtractive approach and resulting materials. As a result, the RC (product of resistance and capacitance) of the conductive lines 122 may be optimized, which may correlate to an increase in the performance of an apparatus containing the device structure 100 by allowing for a reduction in operational speed (e.g., programming time). Furthermore, the methods of the disclosure may reduce or eliminate process acts, such as the formation of etch-stop materials, utilized to form many conventional apparatuses that may be used for similar operations as the device structure 100. By using a single material removal act within a single chamber, the device structure 100 according to embodiments of the disclosure are formed utilizing fewer process acts than conventional device structures. In some instances, the process acts may be reduced by half of that of conventional process acts.

Device structures (e.g., the device structure 100 following processing stage previously described with reference to FIGS. 1A through 1F) according to embodiments of the disclosure may be included in microelectronic devices (e.g., memory devices, such as 3D NAND Flash memory devices). For example, FIG. 2 illustrates a simplified, partial cross-sectional view of a device 201 (e.g., a microelectronic device) including a device structure 200 (e.g., a microelectronic device structure). The device structure 200 may be substantially similar to the device structure 100 following processing stages previously described with reference to FIGS. 1A through 1F. Throughout FIG. 2 and the associated description below, features (e.g., structures, materials, regions) functionally similar to features of the device structure 100 previously described with reference to one or more of FIGS. 1A through 1F are referred to with similar reference numerals incremented by 100. To avoid repetition, not all features shown in FIG. 2 are described in detail herein. Rather, unless described otherwise below, in FIG. 2, a feature designated by a reference numeral that is a 100 increment of the reference numeral of a feature previously described with reference to one or more of FIGS. 1A through 1F will be understood to be substantially similar to and formed in substantially the same manner as the previously described feature.

As shown in FIG. 2, the device structure 200 (including the components thereof previously described with reference to one or more of FIGS. 1A through 1F) of the device 201 may be operatively associated with a stack structure 242 of the device 201. The stack structure 242 includes a vertically alternating (e.g., in the Z-direction) sequence of conductive structures 244 (e.g., access lines, word lines) and insulative structures 246 arranged in tiers 248. In addition, as shown in FIG. 2, the stack structure 242 includes a memory array region 242A, and a staircase region 242B horizontally neighboring (e.g., in the X-direction) the memory array region 242A. As described in further detail below, the device 201 further includes additional components (e.g., features, structures, devices) within horizontal boundaries of the different regions (e.g., the memory array region 242A and the staircase region 242B) of the stack structure 242.

The tiers 248 of the stack structure 242 of the device 201 may each individually include at least one of the conductive structures 244 vertically neighboring at least one of the insulative structures 246. The stack structure 242 may include a desired quantity of the tiers 248. For example, the stack structure 242 may include greater than or equal to eight (8) of the tiers 248, greater than or equal to sixteen (16) of the tiers 248, greater than or equal to thirty-two (32) of the tiers 248, greater than or equal to sixty-four (64) of the tiers 248, greater than or equal to one hundred and twenty-eight (128) of the tiers 248, or greater than or equal to two hundred and fifty-six (256) of the tiers 248 of the conductive structures 244 and the insulative structures 246.

The conductive structures 244 of the tiers 248 of the stack structure 242 may be formed of and include at least one electrically conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively doped semiconductor material (e.g., conductively doped polysilicon, conductively doped Ge, conductively doped SiGe), and at least one conductive metal-containing material (e.g., a conductive metal nitride, a conductive metal silicide, a conductive metal carbide, a conductive metal oxide). In some embodiments, the conductive structures 244 are formed of and include a metallic material (e.g., a metal, such as W; an alloy). In additional embodiments, the conductive structures 244 are formed of and include conductively doped polysilicon. Each of the conductive structures 244 may individually be substantially homogeneous, or one or more of the conductive structures 244 may individually be substantially heterogeneous. In some embodiments, each of the conductive structures 244 of the stack structure 242 is substantially homogeneous. In additional embodiments, at least one (e.g., each) of the conductive structures 244 of the stack structure 242 is heterogeneous. An individual conductive structure 244 may, for example, be formed of and include a stack of at least two different electrically conductive materials. The conductive structures 244 of each of the tiers 248 of the stack structure 242 may each be substantially planar, and may each exhibit a desired thickness.

The insulative structures 246 of the tiers 248 of the stack structure 242 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative structures 246 are formed of and include $SiO_2$. Each of the insulative structures 246 may individually be substantially homogeneous, or one or more of the insulative structures 246 may individually be substantially heterogeneous. In some embodiments, each of the insulative structures 246 of the stack structure 242 is substantially homogeneous. In additional embodiments, at least one (e.g., each) of the insulative structures 246 of the stack structure 242 is heterogeneous. An individual insulative structures 246 may, for example, be formed of and include a stack of at least two different dielectric materials. The insulative structures 246 of each of the tiers 248 of the stack structure 242 may each be substantially planar, and may each individually exhibit a desired thickness.

At least one lower conductive structure 244 of the stack structure 242 may be employed as at least one lower select gate (e.g., at least one source side select gate (SGS)) of the device 201. In some embodiments, a single (e.g., only one) conductive structure 244 of a vertically lowermost tier 248 of the stack structure 242 is employed as a lower select gate (e.g., a SGS) of the device 201. In some embodiments, upper conductive structure(s) 244 of the stack structure 242 may be employed as upper select gate(s) (e.g., drain side select gate(s) (SGDs)) of the device 201. In some embodiments, horizontally neighboring (e.g., in the Y-direction) conductive structures 244 of a vertically uppermost tier 248 of the stack structure 242 are employed as upper select gates (e.g., SGDs) of the device 201. In yet other embodiments, upper select gates of the device 201 may be located vertically above the stack structure 242 (e.g., within an additional stack structure (not shown) of a multi-stack device) overlying the stack structure 242.

Still referring to FIG. 2, within horizontal boundaries (e.g., in the X-direction and the Y-direction) of the memory array region 242A of the stack structure 242, the device 201 may include pillar structures 204 vertically extending through the stack structure 242. As shown in FIG. 2, the pillar structures 204 may be formed to vertically extend substantially completely through the stack structure 242. The pillar structures 204, including a channel material of cell film 204a surrounding a fill material 204b, may correspond to the pillar structures 104, including the channel material of cell film 104a surrounding the fill material 104b, previously described herein with reference to FIG. 1A. For clarity and ease of understanding the drawings and associated description, conductive plug structures 206 are absent in FIG. 2, and are depicted and described above with reference to FIG. 1A as the conductive plug structures 106.

The device structure 200 may be formed to include a desired quantity (e.g., number, amount) of the pillar structures 204. While FIG. 2 depicts the device structure 200 as being formed to include three (3) of the pillar structures 204, the device structure 200 may be formed to include more than three (3) (e.g., greater than or equal to eight (8), greater than or equal to sixteen (16), greater than or equal to thirty-two (32), greater than or equal to sixty-four (64), greater than or equal to one hundred and twenty-eight (128), greater than or equal to two hundred and fifty-six (256)) of the pillar structures 204. Intersections of the pillar structures 204 and the conductive structures 244 of the tiers 248 of the stack structure 242 may define vertically extending strings of memory cells 256 coupled in series with one another within the memory array region 242A of the stack structure 242. In some embodiments, the memory cells 256 formed at the intersections of the conductive structures 244 and the pillar structures 204 within each the tiers 248 of the stack structure 242 comprise so-called "MONOS" (metal-oxide-nitride-oxide-semiconductor) memory cells. In additional embodiments, the memory cells 256 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 256 comprise so-called "floating gate" memory cells including floating gates (e.g., metallic floating gates) as charge storage structures. The floating gates may horizontally intervene between central structures of the pillar structures 204 and the conductive structures 244 of the different tiers 248 of the stack structure 242. The device 201 may include any desired quantity and distribution of the pillar structures 204 within the memory array region 242A of the stack structure 242.

The device 201 may further include conductive lines 222 (e.g., data lines, bit lines) vertically overlying the stack structure 242, at least one source structure 260 (e.g., source line, source plate) vertically underlying the stack structure 242, and at least one control device 258 vertically underlying the source structure 260. The pillar structures 204 may vertically extend between (e.g., in the Z-direction) the conductive lines 222 and the source structure 260. The source structure 260 may vertically extend between the stack structure 242 and the control device 258. The conductive lines 222 and the source structure 260 may each individually be formed of and include at least one electrically conductive material, such as one or more of a metal, an alloy, a conductive metal oxide, a conductive metal nitride, a conductive metal silicide, and a conductively doped semiconductor material. By way of non-limiting example, the conductive lines 222 and/or the source structure 260 may be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), at least one conductively doped semiconductor material (e.g., conductively doped polysilicon, conductively doped Ge, conductively doped SiGe). The device 201 may further include dielectric structures 224 adjacent to (e.g., on or over) the conductive lines 222 and air gaps 232 horizontally adjacent to neighboring conductive lines 222. The dielectric structures 224 and the air gaps 232 may respectively correspond to the dielectric structures 124 and the air gaps 132 previously described with reference to FIGS. 1D through 1F.

With continued reference to FIG. 2, the control device 258 may include devices and circuitry for controlling various operations of other components of the device structure 200. By way of non-limiting example, the control device 258 may include one or more (e.g., each) of charge pumps (e.g., $V_{CCP}$ charge pumps, $V_{NEGWL}$ charge pumps, DVC2 charge pumps); delay-locked loop (DLL) circuitry (e.g., ring oscillators); drain supply voltage ($V_{dd}$) regulators; devices and circuitry for controlling column operations for arrays (e.g., arrays of vertical memory strings) to subsequently be formed within the device structure 200, such as one or more (e.g., each) of decoders (e.g., column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices; and devices and circuitry for controlling row operations for arrays (e.g., arrays of vertical memory strings) within memory regions of the device structure 200, such as one or more (e.g., each) of decoders (e.g., row decoders), drivers (e.g., word line (WL) drivers), repair circuitry (e.g., row repair circuitry), memory test devices, MUX, ECC devices, and self-refresh/wear leveling devices. In some embodiments, the control device 258 includes CMOS (complementary metal-oxide-semiconductor) circuitry. In such embodiments, the control device 258 may be characterized as having a "CMOS under Array" ("CuA") configuration.

Within horizontal boundaries of the staircase region 242B of the stack structure 242, the stack structure 242 may include at least one staircase structure 250. The staircase structure 250 includes steps 252 at least partially defined by horizontal ends (e.g., in the X-direction) of the tiers 248. The steps 252 of the staircase structure 250 may serve as contact regions to electrically couple the conductive structures 244 of the tiers 248 of the stack structure 242 to other components (e.g., features, structures, devices) of the device 201, as described in further detail below. The staircase structure 250 may include a desired quantity of steps 252. In addition, as shown in FIG. 2, in some embodiments, the steps 252 of each of the staircase structure 250 are arranged in order, such that steps 252 directly horizontally adjacent (e.g., in the X-direction) one another correspond to tiers 248 of the stack structure 242 directly vertically adjacent (e.g., in the Z-direction) one another. In additional embodiments, the steps 252 of the staircase structure 250 are arranged out of order, such that at least some steps 252 of the staircase structure 250 directly horizontally adjacent (e.g., in the X-direction) one another correspond to tiers 248 of stack structure 242 not directly vertically adjacent (e.g., in the Z-direction) one another.

Still referring to FIG. 2, the device 201 may further include lower conductive structures 254 physically and electrically contacting at least some (e.g., each) of the steps 252 of the staircase structure 250 of the stack structure 242 to provide electrical access to the conductive structures 244 of the stack structure 242. The lower conductive structures 254 may be coupled to the conductive structures 244 of the tiers 248 of the stack structure 242 at the steps 252 of the staircase structure 250. As shown in FIG. 2, the lower conductive structures 254 may physically contact and upwardly vertically extend (e.g., in the positive Z-direction) from the conductive structures 244 at the steps 252 of the staircase structure 250 to lower contact structures 262 of additional structures (e.g., access devices, vertical transistors) that may be adjacent to (e.g., on or over) the lower contact structures 262.

The device 201 may further include a first isolation material 202 adjacent to (e.g., on or over) the stack structure 242 and a second isolation material 230 adjacent to (e.g., on or over) the first isolation material 202. The first isolation material 202 and the second isolation material 230 may respectively correspond to the first isolation material 102 and the second isolation material 130 of the previously described with reference to FIGS. 1A through 1F. As shown in FIG. 2, the first isolation material 202 may be vertically interposed (e.g., in the Z-direction) between the stack structure 242 and the second isolation material 230. The first isolation material 202 may substantially cover the staircase structure 250 within the staircase region 242B of the stack structure 242, and may substantially surround side surfaces (e.g., sidewalls) of the lower conductive structures 254 on the steps 252 of the staircase structure 250. The first isolation material 202 may exhibit a substantially planar upper vertical boundary, and a substantially non-planar lower vertical boundary complementary to the topography of at least the stack structure 242 (including the staircase structure 250 thereof) thereunder. The second isolation material 230 may substantially cover upper surfaces of the dielectric structures 224 within the memory array region 242A of the stack structure 242. The second isolation material 230 may be formed to seal unfilled spaces between the neighboring conductive lines 222 to form the air gaps 232 (e.g., voids, unfilled volumes) therebetween. The air gaps 232 are laterally adjacent to the conductive lines 222, with a portion of the air gaps 232 extending above a plane of an upper surface of the laterally adjacent conductive lines 222 (e.g., laterally adjacent the dielectric structures 224) and a portion of the air gaps 232 extending below a plane of a lower surface of the laterally adjacent conductive lines 222 (e.g., laterally adjacent the interconnect structures 214 and/or segments of the first isolation material 202). In some embodiments, portions of the second isolation material 230 may be laterally adjacent to side surfaces (e.g., sidewalls) of the first isolation material 202. Contact structures 210 may be located adjacent to (e.g., on or over) uppermost surfaces of the conductive plug structures 206 (not shown) within upper portions of the pillar structures 204. The contact structures 210 may correspond to the contact structures 110 previously described herein with reference to FIG. 1A.

Thus, in accordance with embodiments of the disclosure, a method of forming an apparatus comprises forming pillar structures extending vertically through a first isolation material, forming conductive lines operatively coupled to the pillar structures, forming dielectric structures overlying the conductive lines, and forming air gaps between neighboring conductive lines. The air gaps are laterally adjacent to the conductive lines, with a portion of the air gaps extending above a plane of an upper surface of the laterally adjacent conductive lines and a portion of the air gaps extending below a plane of a lower surface of the laterally adjacent conductive lines.

Furthermore, in accordance with additional embodiments of the disclosure, an apparatus comprises pillar structures extending vertically through an isolation material, conductive lines operatively coupled to the pillar structures, dielectric structures overlying the conductive lines, and air gaps between laterally neighboring conductive lines. The air gaps are laterally adjacent to the conductive lines, with an upper portion of the air gaps extending laterally adjacent to the dielectric structures and a lower portion of the air gaps extending laterally adjacent to segments of the isolation material.

Figure 3:
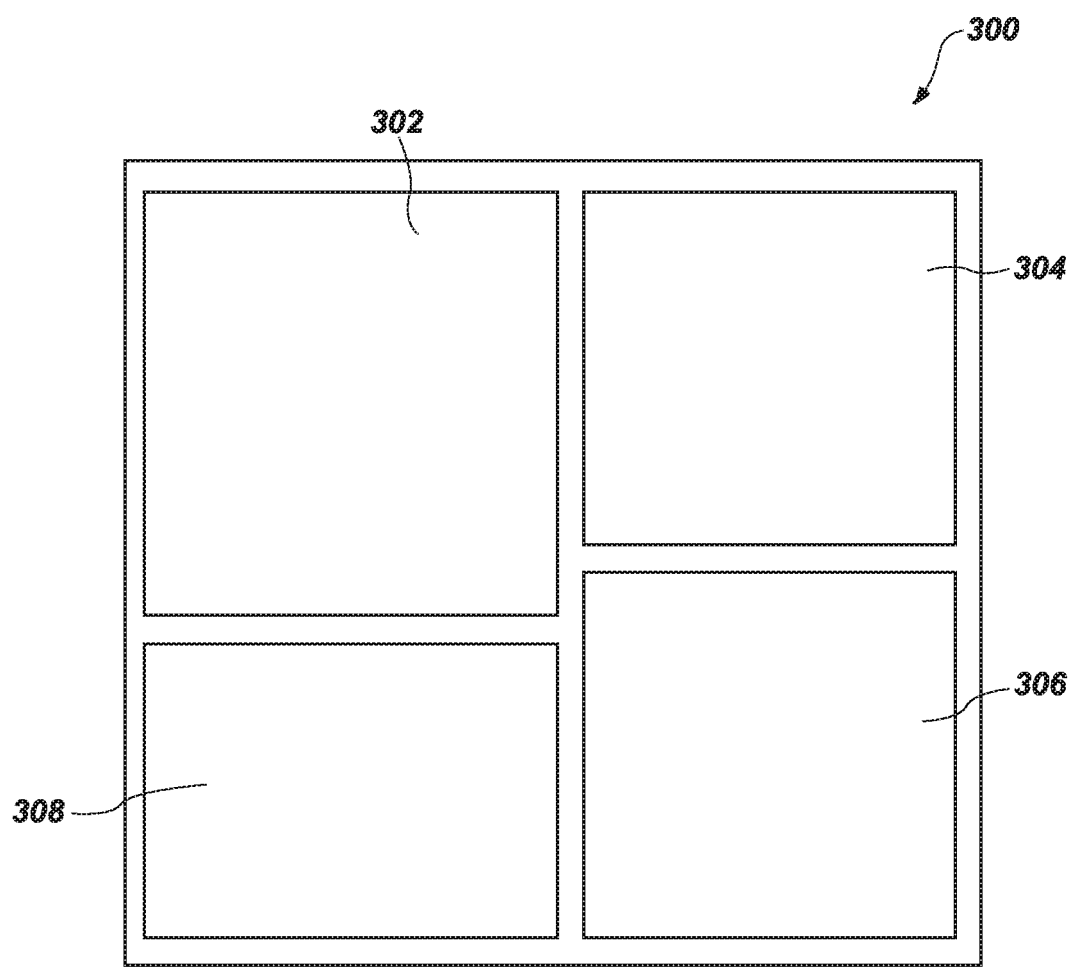
FIG. 3 is a schematic block diagram illustrating a microelectronic device, in accordance with embodiments of the disclosure.

Apparatuses including one or more of the device structures 100, 200 such as those shown in FIGS. 1A through 1F and FIG. 2 may be used in embodiments of microelectronic devices of the present disclosure. FIG. 3 is a block diagram of an illustrative microelectronic device 300 (e.g., a 3D NAND Flash memory device) according to an embodiment of the present disclosure. The microelectronic device 300 may include at least one memory cell array 302 such as, for example, a plurality of memory arrays. The microelectronic device 300 may further include at least one peripheral circuit 304 that inputs data from outside the microelectronic device 300, thus providing access to the at least one memory cell array 302. The microelectronic device 300 may further include a charge pump circuit 306 for generating an input voltage. The peripheral circuit 304 and the charge pump circuit 306 may include one or more capacitors. The peripheral circuit 304 and charge pump circuit 306 may communicate electrically with the at least one memory cell array 302 by way of the capacitors. For example, the microelectronic device 300 may include the memory cell arrays 302, which may include a complementary metal-oxide-semiconductor (CMOS) region, such as CMOS under array (CuA) region 308 underlying the memory cell arrays 302. The memory cell arrays 302 may include memory cells that are connected to access lines (e.g., word lines) and data lines (e.g., bit lines). Further, the CuA region 308 may underlie the memory cell arrays 302 and include support circuitry thereof. The support circuitry may support one or more additional arrays of memory cells present in a stacked configuration. For example, the microelectronic device 300, including the memory cell array 302 having memory cells, can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells. In a stacked configuration, the CuA region 308 may facilitate accessing one or more memory cells in each array. For example, the CuA region 308 may facilitate the transfer of data between a memory cell coupled to a channel of a memory cell array 302, a memory cell coupled to a channel of an additional memory cell array 302 that is coupled to memory cell array 302, and a controller.

Thus, in accordance with embodiments of the disclosure, a method of forming a memory device comprises forming pillar structures in openings vertically extending through a stack of alternating conductive materials and dielectric materials, and forming at least one staircase structure comprising materials of the stack of alternating conductive materials and dielectric materials. The at least one staircase structure is laterally adjacent to the pillar structures. The method comprises forming conductive lines overlying the pillar structures, forming an electrically insulative material overlying at least portions of the stack, and forming air gaps within additional openings vertically extending at least partially through the stack. The air gaps intervene between laterally neighboring conductive lines, and the air gaps are between portions of the electrically insulative material overlying the conductive lines.

Furthermore, in accordance with additional embodiments of the disclosure, a memory device comprising at least one array of memory cells is disclosed. The at least one array of memory cells comprises access lines extending in a first horizontal direction and data lines extending in a second horizontal direction, substantially transverse to the first horizontal direction. The at least one array of memory cells comprises interconnect structures operatively connected to the data lines, dielectric structures adjacent the data lines on a side thereof opposite the interconnect structures, and air gaps extending vertically between laterally neighboring dielectric structures, data lines, and interconnect structures.

Figure 4:
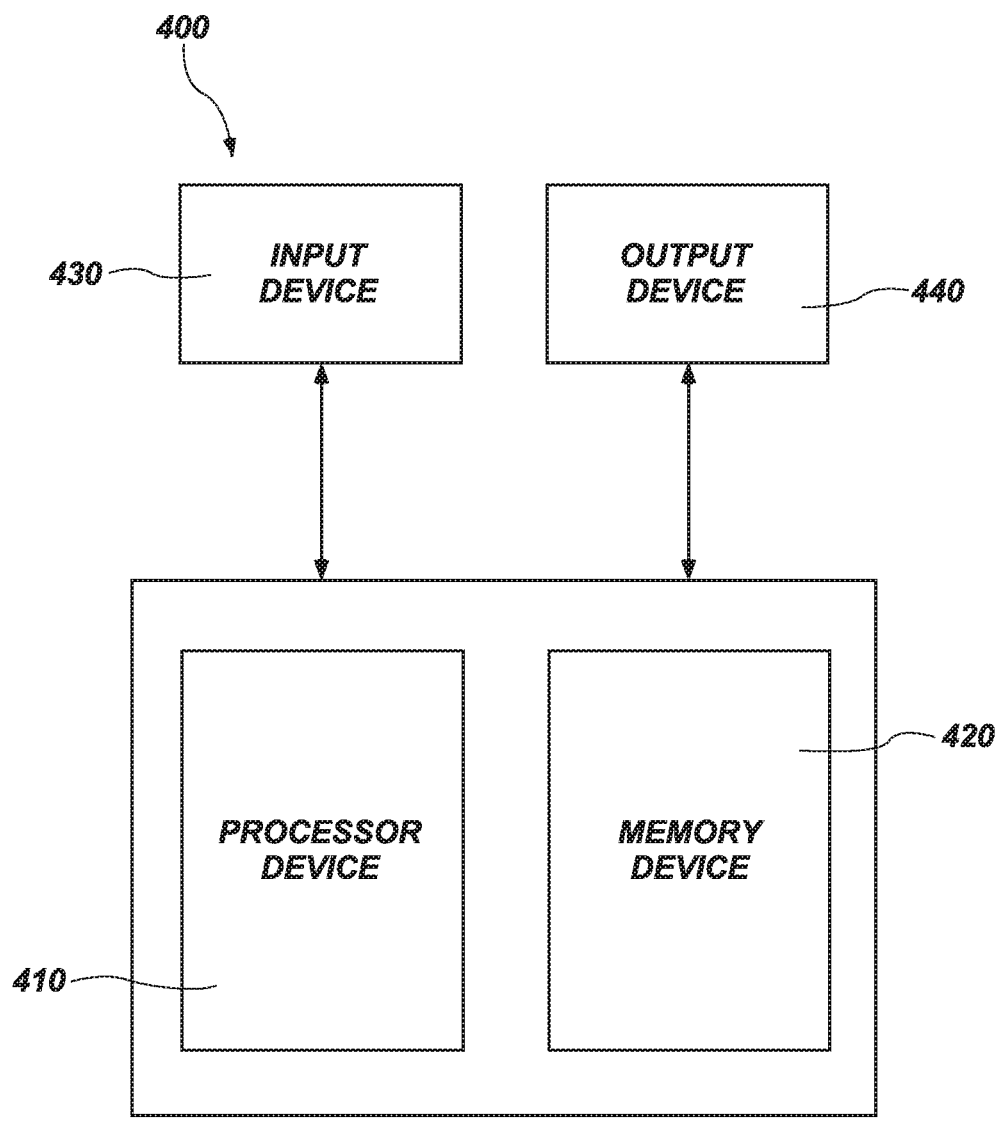
FIG. 4 is a schematic block diagram illustrating an electronic system, in accordance with embodiments of the disclosure.

The device structures (e.g., the device structures 100 previously described with reference to FIGS. 1A through 1F) and microelectronic devices (e.g., the device structure 200 previously described with reference to FIG. 2) in accordance with embodiments of the disclosure may be used in embodiments of electronic systems of the disclosure. For example, FIG. 4 is a block diagram of an illustrative electronic system 400 according to embodiments of the disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 400 includes at least one memory device 420. The memory device 420 may include, for example, an embodiment of a microelectronic device previously described herein (e.g., device structures 100, 200) previously described herein. The electronic system 400 may further include at least one electronic signal processor device 410 (often referred to as a "microprocessor"). The electronic signal processor device 410 may, optionally, include an embodiment of a microelectronic device previously described herein (e.g., the device structures 100, 200). The electronic system 400 may further include one or more input devices 430 for inputting information into the electronic system 400 by a user, such as, for example, a mouse or other pointing device, a keyboard, a touchpad, a button, or a control panel. The electronic system 400 may further include one or more output devices 440 for outputting information (e.g., visual or audio output) to a user such as, for example, a monitor, a display, a printer, an audio output jack, a speaker, etc. In some embodiments, the input device 430 and the output device 440 may comprise a single touchscreen device that can be used both to input information to the electronic system 400 and to output visual information to a user. The input device 430 and the output device 440 may communicate electrically with one or more of the memory device 420 and the electronic signal processor device 410.

Thus, in accordance with embodiments of the disclosure, an electronic system comprises at least one input device, at least one output device, at least one processor device operatively coupled to the at least one input device and the at least one output device, and a memory device operatively coupled to the at least one processor device. The memory device comprises conductive lines extending in a horizontal direction, and air gaps separating horizontally neighboring conductive lines, wherein a ratio of a width of the conductive lines to a width of the air gaps is less than 1.

The structures, devices, and systems of the disclosure advantageously facilitate one or more of improved simplicity, greater packaging density, and increased miniaturization of components as compared to conventional structures, conventional devices, and conventional systems. The methods and structures of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional microelectronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming an apparatus, comprising:
   forming pillar structures extending vertically through a first isolation material;
   forming contact structures adjacent to the pillar structures;
   forming interconnect structures adjacent to the contact structures;
   forming conductive lines operatively coupled to the pillar structures, the interconnect structures directly between and operatively coupled with the contact structures and the conductive lines;
   forming dielectric structures overlying the conductive lines; and
   forming openings vertically extending between each of the dielectric structures, the conductive lines, and the interconnect structures in a single material removal process within a single chamber of a material removal device to form air gaps between neighboring conductive lines, the air gaps laterally adjacent to the conductive lines, with a portion of the air gaps extending above a plane of an upper surface of the laterally adjacent conductive lines and a portion of the air gaps extending below a plane of a lower surface of the laterally adjacent conductive lines.

2. The method of claim 1, wherein forming the interconnect structures comprises forming the interconnect structures in a single damascene process.

3. The method of claim 1, wherein at least some of the air gaps are oriented substantially symmetrically about a vertical midpoint of the conductive lines.

4. The method of claim 1, wherein forming the air gaps comprises forming a second isolation material adjacent to upper surfaces of the dielectric structures, at least a portion of the second isolation material being formed laterally adjacent to the first isolation material.

5. The method of claim 1, wherein forming the air gaps comprises extending the air gaps between laterally neighboring dielectric structures and extending the air gaps between laterally neighboring segments of the first isolation material.

6. The method of claim 1, wherein forming the conductive lines comprises forming a continuous portion of a conductive material adjacent to the first isolation material and removing portions of the conductive material to form the conductive lines in a single subtractive patterning process.

7. An apparatus, comprising:
   pillar structures extending vertically through an isolation material;
   conductive plug structures within upper portions of the pillar structures;
   conductive lines operatively coupled to the pillar structures;
   dielectric structures overlying the conductive lines; and
   air gaps between laterally neighboring conductive lines, the air gaps vertically aligned with a portion of the conductive plug structures and laterally adjacent to the conductive lines, with an upper portion of the air gaps extending laterally adjacent to the dielectric structures and a lower portion of the air gaps extending laterally adjacent to segments of the isolation material.

8. The apparatus of claim 7, wherein a width of the air gaps in a horizontal direction is relatively larger than a width of the conductive lines in the horizontal direction.

9. The apparatus of claim 7, wherein a height of the air gaps in a vertical direction is relatively larger than a combined height of the conductive lines and the dielectric structures in the vertical direction.

10. The apparatus of claim 7, further comprising interconnect structures underlying and operatively coupled to the conductive lines, the air gaps between laterally neighboring interconnect structures.

11. The apparatus of claim 7, wherein the dielectric structures comprise segmented portions of a hard mask material.

12. The apparatus of claim 7, wherein a height of the air gaps is substantially equal to a combined height of the dielectric structures, the conductive lines, and the segments of the isolation material.

13. The apparatus of claim 7, wherein portions of the isolation material form an L-shaped structure surrounding the air gaps on at least two consecutive sides.

14. The apparatus of claim 7, wherein the conductive plug structures are laterally adjacent and electrically coupled to a channel material of the pillar structures.

15. A method of forming a memory device, comprising:
forming pillar structures in openings vertically extending through a stack of alternating conductive materials and dielectric materials;
forming at least one staircase structure comprising materials of the stack of alternating conductive materials and dielectric materials, the at least one staircase structure laterally adjacent to the pillar structures;
forming contact structures over the pillar structures;
forming a substantially continuous portion of a conductive material over the contact structures;
forming an electrically insulative material over at least portions of the stack;
forming additional openings vertically extending at least partially through the stack by removing portions of the substantially continuous portion of the conductive material to form conductive lines; and
forming a dielectric material adjacent to the electrically insulative material to form air gaps within the additional openings, the air gaps intervening between laterally neighboring conductive lines and in vertical alignment with a portion of the contact structures, and the air gaps between portions of the electrically insulative material overlying the conductive lines.

16. The method of claim 15, further comprising forming the additional openings to extend vertically through each of the electrically insulative material, the conductive lines, and at least portions of the dielectric materials of the stack, wherein forming the additional openings comprises removing material from each of the electrically insulative material, the substantially continuous portion of the conductive material, and the at least portions of the dielectric materials of the stack in a single material removal process.

17. The method of claim 15, further comprising forming conductive via structures underlying the conductive lines, wherein forming the air gaps comprises separating laterally neighboring conductive via structures from one another with one or more of the air gaps.

18. The method of claim 17, wherein forming the conductive via structures comprises forming the conductive via structures to be self-aligned with the conductive lines along at least one side surface of the conductive via structures.

19. The method of claim 15, wherein forming the air gaps within the additional openings comprises forming a single air gap between the laterally neighboring conductive lines, the single air gap extending above a plane of an upper surface of the laterally neighboring conductive lines and a portion of the air gaps extending below a plane of a lower surface of the laterally neighboring conductive lines.

20. The method of claim 15, wherein forming the pillar structures comprises forming memory pillar structures comprising a channel material of a cell film surrounding a fill material.

21. The method of claim 15, wherein forming the stack of alternating conductive materials and dielectric materials comprises forming the stack vertically over a control device comprising complementary metal oxide semiconductor (CMOS) circuitry.

22. The method of claim 21, further comprising forming a source tier vertically between the control device and the stack.

23. The method of claim 15, wherein portions of the dielectric materials of the stack vertically intervene between the air gaps and the contact structures.

24. A memory device, comprising:
at least one array of memory cells comprising:
access lines extending in a first horizontal direction;
data lines extending in a second horizontal direction, substantially transverse to the first horizontal direction;
interconnect structures operatively connected to the data lines;
contact structures adjacent the interconnect structures on a side thereof opposite the data lines;
dielectric structures adjacent the data lines on a side thereof opposite the interconnect structures; and
air gaps extending vertically between laterally neighboring dielectric structures, data lines, and interconnect structures, the air gaps vertically aligned with a portion of the contact structures, wherein a width of the data lines in the first horizontal direction is relatively less than a width of the air gaps in the first horizontal direction.

25. The memory device of claim 24, wherein the interconnect structures are laterally adjacent an oxide material without being laterally adjacent a nitride material.

26. The memory device of claim 24, wherein a height of the air gaps is within a range of from about 50 nm to about 100 nm.

27. The memory device of claim 24, further comprising:
pillar structures extending vertically through the at least one array of memory cells;
a source structure underlying the at least one array of memory cells; and
a control device electrically coupled to the data lines and the source structure, wherein the pillar structures comprise strings of memory cells electrically coupled to the data lines and the source structure.

28. The memory device of claim 24, wherein a height of the air gaps is substantially equal to a combined height of the dielectric structures, the data lines, and a portion of the interconnect structures.

29. An electronic system, comprising:
at least one input device;
at least one output device;

at least one processor device operatively coupled to the at least one input device and the at least one output device; and a memory device operatively coupled to the at least one processor device, the memory device comprising:
conductive lines extending in a horizontal direction;
interconnect structures underlying the conductive lines;
contact structures underlying the interconnect structures; and
air gaps separating horizontally neighboring conductive lines and in direct vertical alignment with at least a portion of the contact structures, wherein a ratio of a width of the conductive lines to a width of the air gaps is less than 1.

30. The electronic system of claim 29, wherein the conductive lines comprise bit lines, elongated portions of the air gaps extending in the horizontal direction with at least portions of the air gaps located immediately adjacent to the bit lines.

31. The electronic system of claim 29, wherein the memory device comprises a 3D NAND Flash memory device.

* * * * *

UNITED STATES PATENT AND TRADEMARK OFFICE
CERTIFICATE OF CORRECTION

PATENT NO. : 11,456,208 B2
APPLICATION NO. : 16/990463
DATED : September 27, 2022
INVENTOR(S) : Sidhartha Gupta et al.

It is certified that error appears in the above-identified patent and that said Letters Patent is hereby corrected as shown below:

In the Specification

| | | |
|---|---|---|
| Column 6, | Line 41, | change "includes Sift." to --includes $SiO_2$.-- |
| Column 8, | Line 22, | change "Six), titanium" to --$Si_x$), titanium-- |
| Column 9, | Line 60, | change "(Ti Six)," to --$(TiSi_x)$,-- |
| Column 10, | Line 35, | change "Six), titanium" to --$Si_x$), titanium-- |
| Column 15, | Line 65, | change "includes Sift." to --includes $SiO_2$.-- |
| Column 18, | Line 31, | change "depth Di" to --depth $D_1$-- |
| Column 18, | Line 32, | change "depth Di" to --depth $D_1$-- |

Signed and Sealed this
Twenty-eighth Day of February, 2023

Katherine Kelly Vidal
*Director of the United States Patent and Trademark Office*